(12) United States Patent
Fadayomi et al.

(10) Patent No.: US 12,191,161 B2
(45) Date of Patent: Jan. 7, 2025

(54) MULTI-STEP ISOTROPIC ETCH PATTERNING OF THICK COPPER LAYERS FOR FORMING HIGH ASPECT-RATIO CONDUCTORS

(71) Applicant: Intel Corporation, Santa Clara, CA (US)

(72) Inventors: Oladeji Fadayomi, Chandler, AZ (US); Jeremy Ecton, Gilbert, AZ (US); Oscar Ojeda, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 866 days.

(21) Appl. No.: 17/132,282

(22) Filed: Dec. 23, 2020

(65) Prior Publication Data

US 2022/0199427 A1 Jun. 23, 2022

(51) Int. Cl.
*H01L 23/49* (2006.01)
*H01L 21/48* (2006.01)
*H01L 23/498* (2006.01)

(52) U.S. Cl.
CPC .... *H01L 21/4846* (2013.01); *H01L 23/49838* (2013.01); *H01L 23/49827* (2013.01)

(58) Field of Classification Search
CPC ............ H01L 21/4846; H01L 23/49838
USPC ...................................................... 257/774
See application file for complete search history.

(56) References Cited

U.S. PATENT DOCUMENTS

| 5,118,385 | A | 6/1992 | Kumar et al. |
| 9,418,928 | B2 * | 8/2016 | Liang ................ H01L 24/16 |
| 10,163,774 | B2 * | 12/2018 | Liang ............... H05K 1/0268 |
| 2010/0263923 | A1 | 10/2010 | Kodani et al. |
| 2012/0222894 | A1 | 9/2012 | Kaneko et al. |
| 2014/0159249 | A1 * | 6/2014 | Uzoh ............ H01L 23/49827 257/774 |
| 2018/0254238 | A1 * | 9/2018 | Tsai ................... H01L 24/81 |

OTHER PUBLICATIONS

Extended European Search Report for European Patent Application No. 21196207.1, dated Apr. 5, 2022.

* cited by examiner

*Primary Examiner* — Phuc T Dang
(74) *Attorney, Agent, or Firm* — Essential Patents Group, LLP

(57) ABSTRACT

An integrated circuit device, comprising a substrate comprising a dielectric material and a conductor on or within the dielectric material of the substrate. The conductor comprises a first portion comprising a first sloped sidewall, wherein a first base width of the first portion is greater than a first top width of the first portion. The conductor also comprises a second portion over the first portion, the second portion comprising a second sloped sidewall, wherein a second base width of the upper portion is greater than both a second top width of the second portion and the first top width of the first portion.

25 Claims, 17 Drawing Sheets

MULTI-STEP ISOTROPIC ETCH PATTERNING OF THICK COPPER LAYERS FOR FORMING HIGH ASPECT-RATIO CONDUCTORS

BACKGROUND

Current low-cost copper patterning processes (e.g., isotropic copper wet etching) produce low-aspect ratio conductors (e.g., less than 1:1). Existing subtractive isotropic copper etch processes may result in undesirable lateral etch (undercut). This undercut inhibits the scaling down of core pattern feature sizes of a substrate (pad diameters, trace and space widths). Undercut becomes more significant with increased copper thickness due to the isotropic nature of wet chemistry etch. This means that the existing wet subtractive etch process technologies used in core patterning of substrate package may not meet future design rule (DR) forecasts which call for increased line-space (L/S) resolution for large power conductors. L/S resolution may be increased by low-cost formation of high aspect ratio thick conductors. Advanced copper patterning methods using low-cost wet subtractive etching processes are needed to produce high-aspect ratio thick conductors for meeting future design rules for smaller line widths and spacing (L/S) for power conductors.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Disclosed herein are thick high-aspect ratio thick conductors formed by a multi-step subtractive isotropic etch (MSIEP) patterning process. The MSIEP process is a low-cost wet etch method that may be employed to form higher aspect ratios for thick conductors (e.g., power conductors) compared to existing subtractive etch core patterning. As noted above, existing subtractive isotropic copper etch processes may result in undesirable lateral etch (undercut). Large undercut inhibits the scaling down of core pattern feature sizes of a substrate (pad diameters, trace and space widths). Undercut becomes more significant with increased copper thickness due to the isotropic nature of wet chemistry etch. The disclosed MSIEP process, particularly applied to thick copper layers on package cores, may enable continuous scaling of power conductors in order to meet future design rules. As an added advantage, the etch resolution from this patterning technique does not rely heavily on substrate copper thickness limitation.

Views labeled "cross-sectional", "profile", "plan", and "isometric" correspond to orthogonal planes within a cartesian coordinate system. Thus, cross-sectional and profile views are taken in the x-z plane, plan views are taken in the x-y plane, and isometric views are taken in a 3-dimensional cartesian coordinate system (x-y-z). Where appropriate, drawings are labeled with axes to indicate the orientation of the figure.

Figure 1:
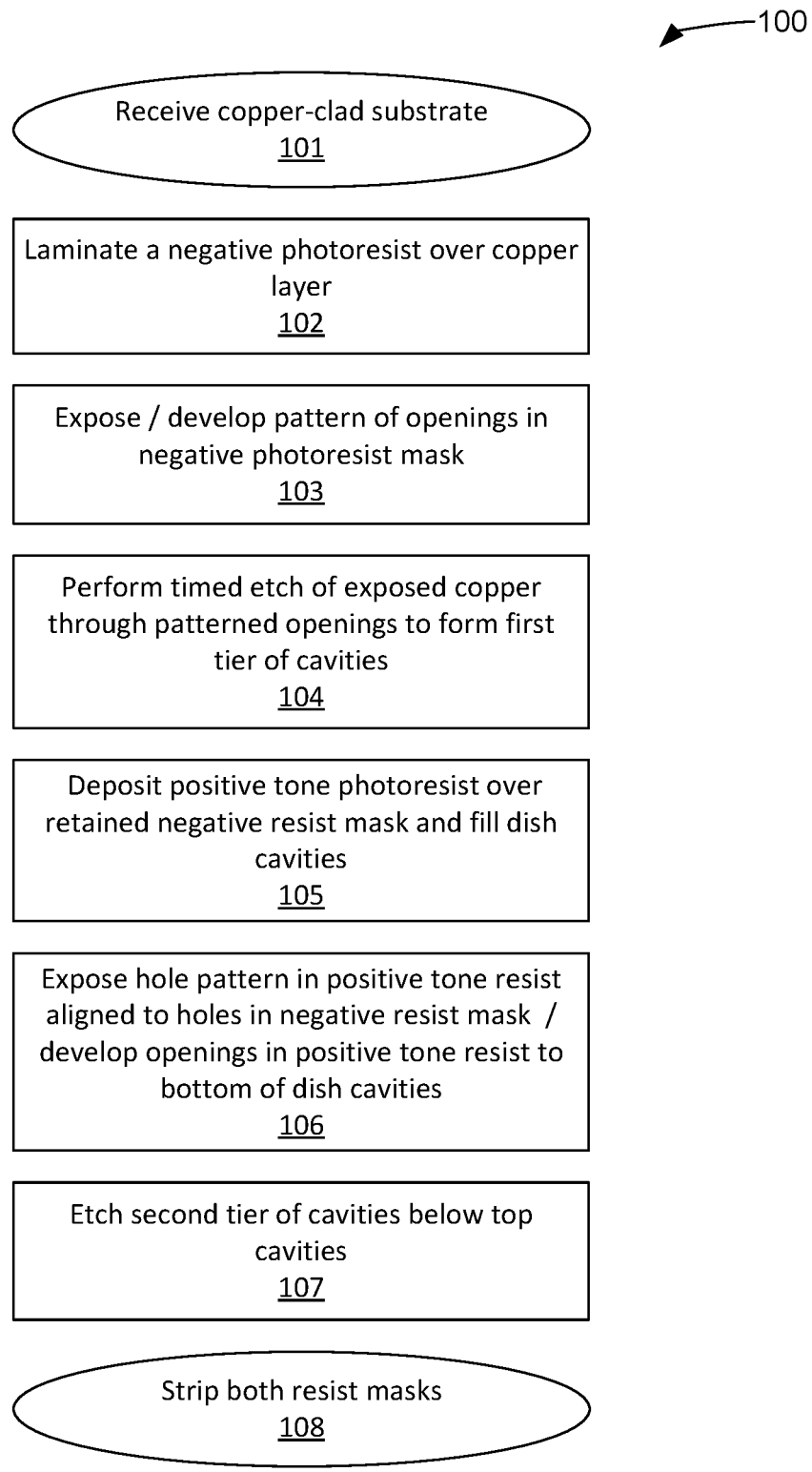
FIG. 1 presents process flow chart summarizing an exemplary dual subtractive etch process flow for the formation of high aspect-ratio conductors in thick copper layers, according to some embodiments of the disclosure.

FIG. 1 presents process flow chart 100, summarizing an exemplary dual subtractive etch process flow for the formation of high aspect-ratio conductors in thick copper layers, according to some embodiments of the disclosure.

At operation 101, a copper-clad package core for an integrated circuit package is introduced into a dual subtractive copper etch process for patterning high-aspect ratio conductors on the core substrate. The package core may comprise relatively thick un-patterned copper layers (e.g. 35 microns or greater), one on each side of the core dielectric. The package core may be one of multiple unsingulated package cores distributed on a core panel or wafer. Patterning of the core copper layers may be the starting point for formation of a package substrate. In some embodiments, the dielectric portion of the package core may comprise a prepreg sheet, comprising woven glass fiber within an epoxy resin matrix. In some embodiments, the prepreg sheet is approximately 30 microns thick. A carrier may be attached to the core panel or wafer for mechanical support.

At operations 102 and 103, a negative-tone photoresist may be deposited over one or both of the copper layers. In some embodiments, the negative photoresist is laminated as a sheet over one or both of the copper layers. The negative-tone photoresist may be lithographically patterned with an array of openings that may be a series of parallel lines. The copper exposed within the line openings may be etched to form spaces between multiple parallel line traces. In some embodiments, the line openings may have widths as small as 2 microns. The openings may be shaped as slots, circles, squares or rectangles. As an example, arrays of openings may comprise parallel slots exposing spaces between lines of copper that are to be trace conductors.

At operation 104, shallow cavities are formed by isotropic chemical etching of exposed copper within the openings in the negative photoresist etch mask formed in the previous operation. The cavities may be etched vertically and horizontally at approximately the same rates in an isotropic etch, creating cavities having substantially semicircular or ovoid cross sections. Suitable cavity dimensions may be obtained by timing the etch to limit its extent. Cavities may have substantially the same shape as the openings through which they are etched. Cavities may extend longitudinally along the length of the slot openings.

At operations 105 and 106, a negative-tone or positive-tone liquid photoresist may be deposited over the negative-tone photoresist etch mask formed in the previous operation and within the cavities through the primary openings in the negative-tone photoresist. The liquid photoresist may be applied by spin-coating, spray coating or electrodeposition to completely fill the cavities. After deposition, the liquid photoresist may be hardened and patterned through a second lithographic mask to form secondary openings within the positive tone resist over the cavities. The secondary openings may be aligned to the centers of the primary openings. In some embodiments, a second lithographic mask may not be needed for patterning a positive tone photoresist within the cavities. The initial resist pattern in the negative-tone photoresist etch mask may be employed as a contact mask positive tone photoresist may be illuminated by a flood exposure using the negative-tone photoresist etch mask as a contact mask, resulting in self alignment to the initial resist for self-alignment of the secondary openings formed in the positive-tone photoresist within the cavities during the second exposure. A bias (e.g., overhang) of the primary openings may shield positive-tone photoresist at the sidewalls of the cavities, leaving sidewalls protected from etching in subsequent operations. Employment of a positive-tone photoresist may reduce costs as well as enable finer L/S since a second mask would require multiple alignment steps resulting in alignment offset. For the self-aligned approach with positive resist there would be no offset. Secondary openings may extend the depth of the cavities to expose a portion of the cavity bottoms for a second isotropic etch. For example, secondary openings formed in the positive-tone resist within the primary slots may extend along the length of the primary slot, but have a smaller width than the primary slots.

At operation 107, a second set of cavities may be etched directly under the first set of cavities formed at operation 104. Similar to the primary openings, the secondary openings may be slots, circles, squares or rectangles, following the shape of the primary openings. Etchant may penetrate through the secondary openings in the positive-tone photoresist etch mask to contact the bottom of the upper cavities, etching the secondary cavities isotropically. The lower cavity etch may be timed to form an undercut that extends laterally beyond the undercut (lateral extent) of the upper cavities. In some embodiments, the second isotropic etch may be timed to produce a greater undercut and depth of the lower cavities relative to the upper cavities. In some embodiments, the dimensions of the lower cavities may be substantially the same as the upper cavities. In other embodiments, the lower cavity dimensions may be smaller than those of the upper cavities. In some embodiments, the lower cavities are vertically etched to the interface between the copper layer and the dielectric core, exposing the dielectric material between copper conductors or other structures.

The second etch may be timed to produce an undercut that permits a desired distance between adjacent cavities. For example, copper regions intervening between slot cavities may be parallel trace conductors. Operations 105-107 may be repeated multiple times in succession to vertically etch out a stack of interconnected cavities at successively lower depths within the copper layer. The cavity stack may extend through the thickness of the copper layer to the dielectric core underlying the copper layer, exposing the surface of the dielectric core between regions of unetched copper.

By rigorously timing each etch step, lateral and vertical dimensions of each cavity within the stack of cavities may be controlled within desired limits to produce desired conductor widths and pitches. The widest dimensions of adjacent stacks may be spacings between adjacent conductors formed by the dual etch. Widths of adjacent conductors and spaces therebetween may be controlled to produce high-aspect ratio (e.g., the z-height-to-width ratio) conductors. Single-step isotropic copper etches generally produce low-aspect ratio structures (e.g.,1:1 or 2:1) as a result of the isotropic undercut being substantially the same as the vertical etch. A succession of short isotropic etches according to operations 103-107 may enable formation of high-aspect ratio copper structures using an isotropic chemical etch. Isotropic chemical etch procedures are substantially less costly and time-consuming than anisotropic etch procedures aimed specifically at producing high-aspect ratio structures. By excavating small cavities below previously formed cavities having similar or progressively smaller or larger dimensions, the lateral extent of each cavity formed at each vertical level within the copper layer may be limited to 10 microns or less.

Depending on the timing of each successive etch, substantially equal or unequal undercuts and depths of cavities may be produced at each level. Adjacent copper structures (e.g., trace conductors) may have substantially vertical or sloped sidewalls as a result. For example, substantially vertical sidewalls may result from producing cavities at each level having substantially similar lateral undercut. Sloped sidewalls may result by changing the lateral undercut at each level.

Sidewalls of adjacent copper structures may exhibit a scalloped substructure resulting from the shape of the cavity sidewall at each cavity level. For example, the isotropic etch may produce a semicircular or ovoid cavity shape as noted above, producing a convex etch of the sidewalls of adjacent copper regions at each cavity level. Due to undercut described above, some copper may overhang the convex sidewalls, producing a pagoda-like cross section of the adjacent copper conductors.

At operation 108, both the positive-tone and negative-tone photoresist may be removed by suitable stripping baths, exposing an array of conductive structures, each structure adjacent to surrounding cavity stacks.

FIGS. 2A-2I illustrate cross-sectional views in the x-z plane of an exemplary method for forming high-aspect ratio conductive structures by dual-step subtractive isotropic etch patterning of a thick copper layer, according to some embodiments of the disclosure.

Figure 2A:
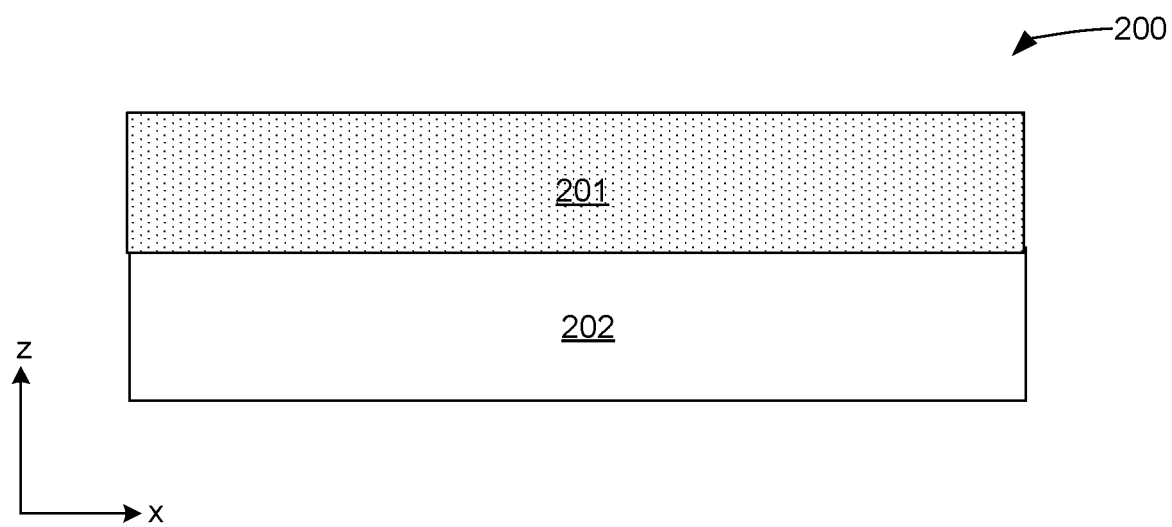
FIGS. 2A-2I illustrate cross-sectional views in the x-z plane of an exemplary method for forming high-aspect ratio thick conductors by dual-step subtractive isotropic etch patterning of a thick copper layer, according to some embodiments of the disclosure.

In the operation shown in FIG. 2A, a core for an IC package is shown. Package core 200 comprises copper layer 201 over dielectric substrate 202. As noted above, dielectric substrate 202 may comprise a prepreg material, comprising a woven glass cloth embedded in an epoxy resin. Copper layer 201 may be a relatively thick foil having a z-height of 30 microns or greater, laminated on dielectric substrate 202.

Figure 2B:
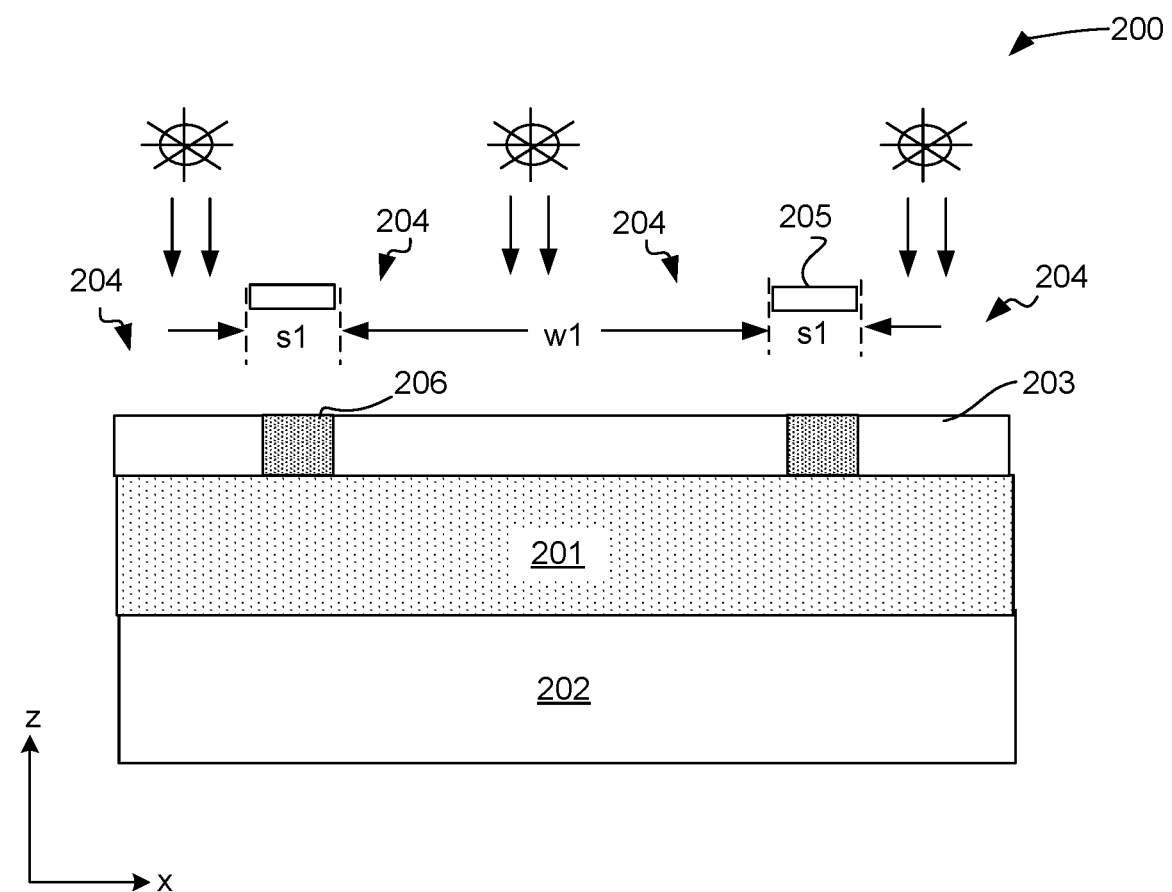

In the operation shown in FIG. 2B, a negative-tone photoresist 203 is deposited over copper layer 201. Photoresist 203 may be a solid resist that is deposited by roller lamination. Photoresist 203 may be subsequently exposed to ultraviolet (UV) illumination through lithographically defined openings 204 in photomask 205. The UV illumination polymerizes exposed regions 206 of the negative-tone photoresist, leaving unilluminated regions 206 that are shaded by photomask 205 partially polymerized and able to be removed by a suitable solvent.

Figure 2C:
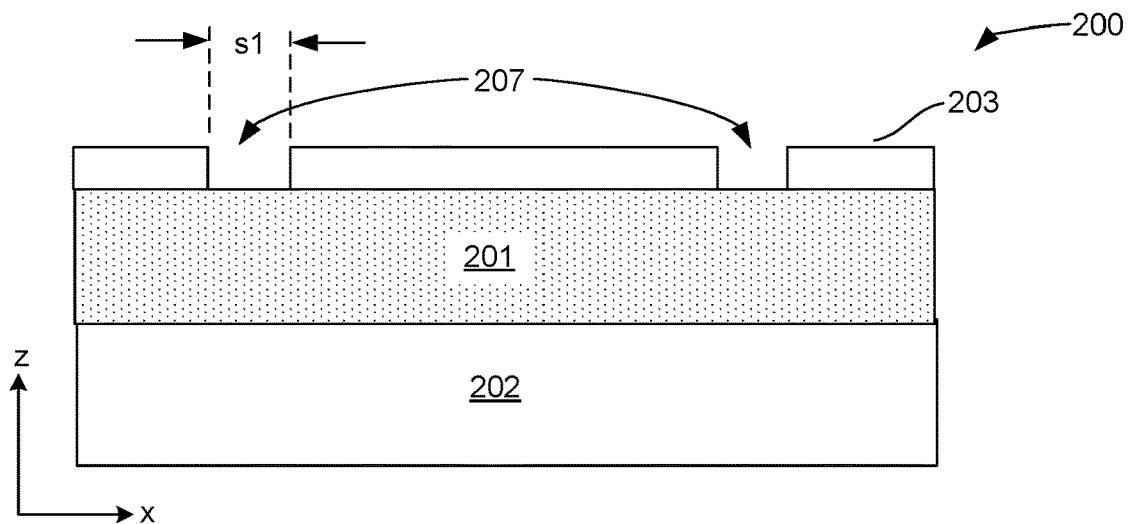

In the operation shown in FIG. 2C, negative-tone photoresist 203 is developed post-illumination to remove material from non-illuminated regions 206, forming openings 207. Openings 207 may expose underlying regions of copper layer 201 for etching cavities in a subsequent operation. Negative-tone photoresist 203 may be employed as an etch mask for subsequent chemical etching of copper layer 201.

Openings 207 may have any desired shape. For example, openings 207 may be an array of parallel slots for producing an array of parallel trace conductors having a width w1. Regions 206 may have a width s1 for spaces between trace conductors. In other embodiments, openings 207 may be circular or rectangular rings for etching material around the perimeter of isolated circular or rectangular conductors, for example, to produce vias and pillars. In alternative embodiments, openings 207 may be arranged in a grid array of rectangular openings to form a wire grid. Minimal dimensions of openings 207 may be 10 microns or less, substantially smaller than mask opening dimensions employed in conventional isotropic wet etching.

Figure 2D:
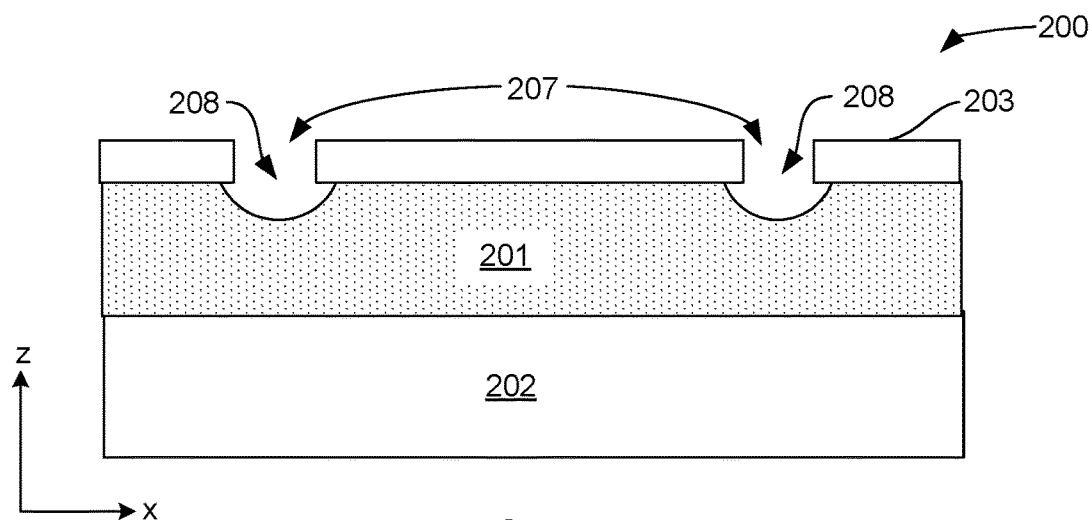

In the operation shown in FIG. 2D, core 200 is subjected to a first isotropic chemical copper etch to form cavities 208 in copper layer 201. Etch activity may initiate at openings 207 and spread laterally and vertically (in the z direction), undercutting negative-tone photoresist 203 as the etch progresses vertically. The chemical etch may comprise a wet copper etch bath solution comprising cupric chloride, iron (III) chloride or an iodine/iodide couple. Generally, the wet etch solution may not have modifiers or additives to influence anisotropic etch rates. In some embodiments, additives may be included in the etch bath to increase anisotropy. For example, a banking agent may be added to a wet etch bath to reduce the lateral etch rate in favor of the vertical etch rate. In this way, conductive features having an aspect ratio may that is higher than what is achievable by isotropic etching alone.

Cavities 208 may be etched to any suitable depth. Lateral etching may occur at a rate that is similar to the vertical etch rate. Due to lateral etching (e.g., undercut), cavities 208 may have a substantially semicircular or ovoid profile or cross section. The etch may be controlled by precise timing to limit vertical and lateral extents of cavies 208. In general, the etch may be timed to limit the lateral dimension (e.g., width) of cavities 208 to 10 microns or less. Openings 207 may be dimensioned to correspond approximately to the width of cavities 208. In some embodiments, some degree of undercut may be present in the profile of cavities 208, depending on the relative rates of vertical and lateral etch.

Figure 2E:
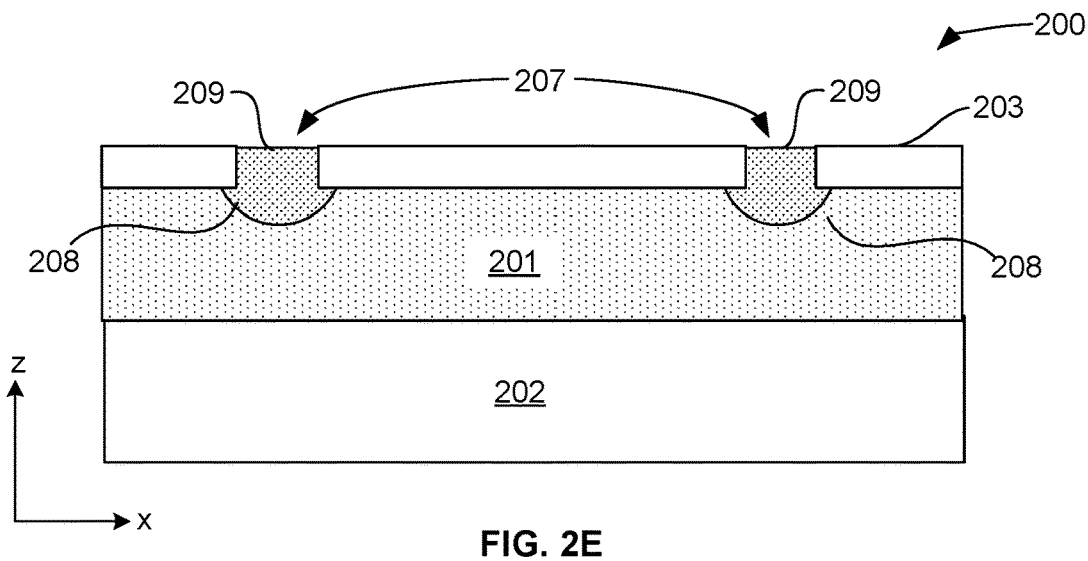

In the operation shown in FIG. 2E, a negative- or a positive-tone liquid second photoresist 209 is deposited into cavities 208. Second photoresist 209 may be spin-coated, spray coated or electrodeposited over negative-tone photoresist 203 etch mask, filling cavities 208 by capillary action. Following application, liquid photoresist 209 may be bake-hardened by thermal treatment.

Figure 2F:
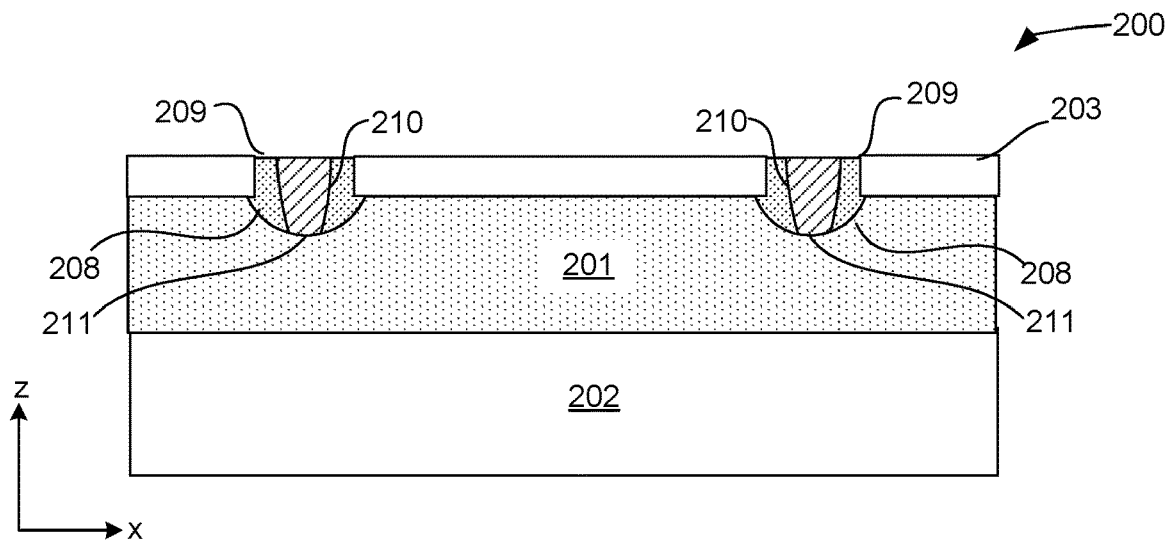

In the operation shown in FIG. 2F, second photoresist 209 is patterned by exposure to UV illumination through a second lithographically-patterned photomask (not shown), according to some embodiments. A second lithographic mask may have openings centered over cavities 208. UV illumination may depolymerize regions 210, enabling removal of material from regions 210 to create openings in a subsequent operation. Regions 210 may extend to floors 211 of cavities 208, as shown. In some embodiments, a second lithographic mask may not be needed for patterning a positive tone photoresist within the cavities. Liquid photoresist 209 may be a positive-tone photoresist illuminated by a flood exposure. Primary openings 207 in negative-tone photoresist etch mask 203 may provide a pattern to which exposed regions 210 within cavities 208 may be self-aligned. A bias (e.g., overhang) of the primary openings may shield positive-tone photoresist at the sidewalls of the cavities from UV exposure, leaving sidewalls protected from etching in subsequent operations. Employment of a positive-tone photoresist may reduce costs as well as enable finer L/S since a second mask would require multiple alignment steps resulting in alignment offset. For the self-aligned approach with a positive resist, there is no offset. Exposed regions 209 may extend to floors 211 of cavities 208 to expose copper at the bottoms of cavities 208 in a subsequent operation.

Figure 2G:
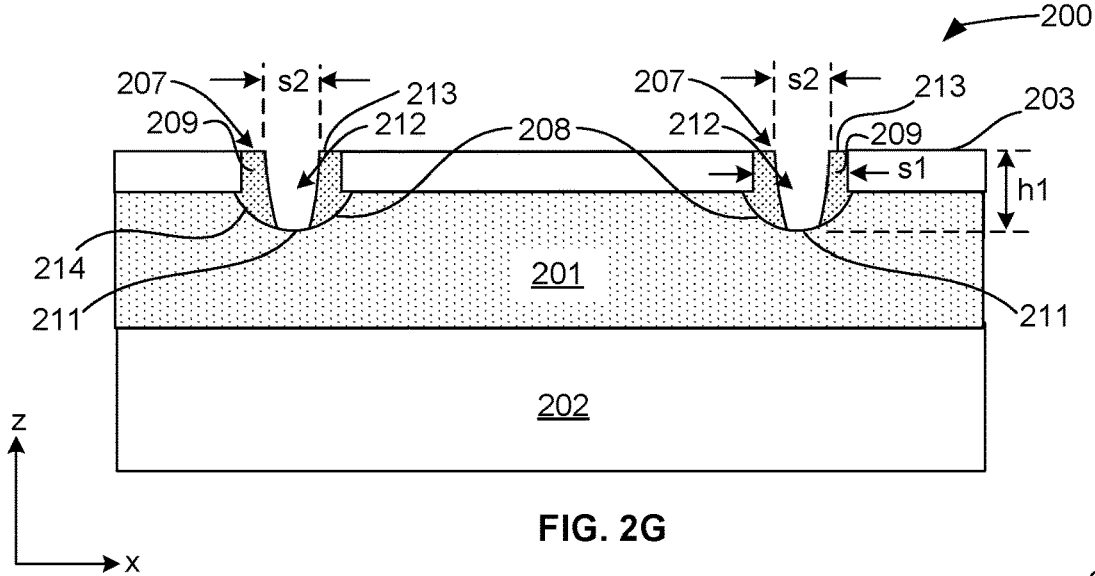

In the operation shown in FIG. 2G, secondary openings 212 are created by post-illumination development of second photoresist 209. Un-crosslinked material in regions 210 is removed by a suitable solvent, creating openings 212 that extend the depth dl from the surface 213 of positive-tone photoresist 209 to floors 211 of cavities 208, exposing copper at the bottoms of cavities 208. Openings 212 may be aligned to the center of openings 207 and generally follow the geometry of openings 207. In the illustrated embodiment, openings 212 have a width s2, which may be less than or equal to width s1 of openings 207 (in negative-tone photoresist 203). Remaining second photoresist 209 may cover sidewalls 214 of cavities 208, protecting them from further chemical attack in a subsequent etch operation. Sidewalls 214 may be convex in profile, as shown. In some embodiments, sidewalls 214 may have substantially straight slopes.

Figure 2H:
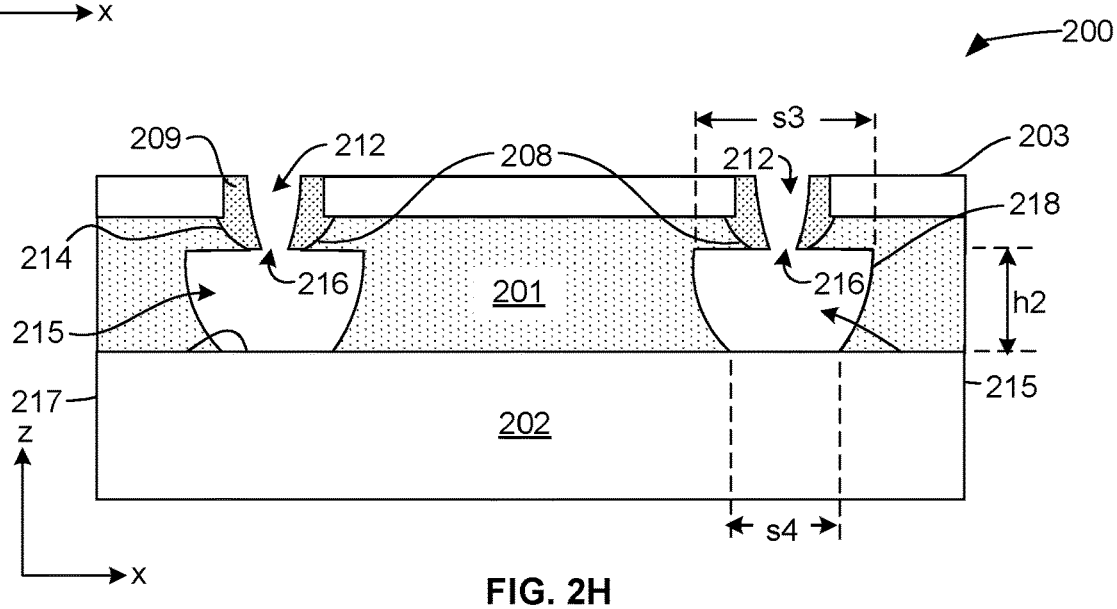

In the operation shown in FIG. 2H, core 200 is subjected to a second copper etch to form cavities 215 below cavities 208. Etchant may penetrate through openings 212 to reach exposed copper at cavity floors 211 (FIG. 2G). Sidewalls 214 are protected from further etching by second photoresist 209, as mentioned above. Thus, exposed copper at the bottoms of cavities 208 is attacked by etchant, removing copper at mouths 216 of openings 212 and expanding under upper cavities 208 to form lower cavities 215. The isotropic etch may have a lateral etch rate similar to the vertical etch rate, resulting in a bowl-like profile of cavities 215, as shown. Cavities 215 may be vertically etched to a depth d2 that is limited at the boundary 217 with dielectric 202. Lateral etching may continue even after the vertical etch has reached dielectric 202 and stops, resulting in undercut 218 below upper cavities 208 to extend beyond the bottom of cavities 215. In the illustrated embodiment, cavities 215 have an upper width s3 that is greater than lower width s4.

Figure 2I:
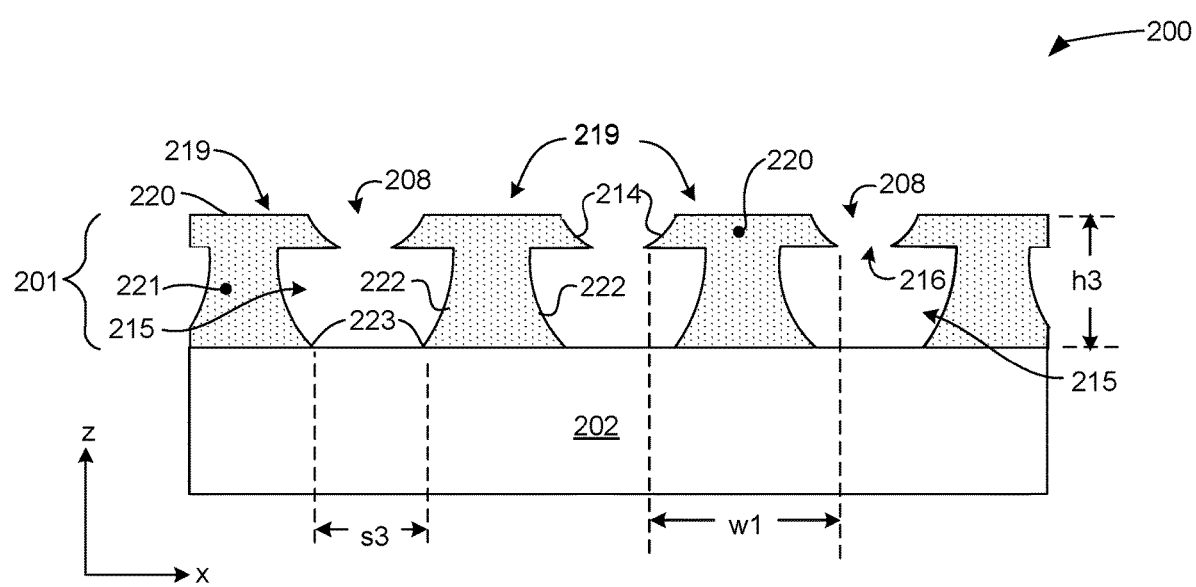

In the operation shown in FIG. 2I, negative-tone photoresist etch mask 203 and second photoresist 209 are stripped to reveal the completed patterning of copper layer 201 to form conductors 219. In the illustrated embodiment, conductors 219 have an upper portion 220 adjacent to cavities 208 and lower portion 221 adjacent to cavities 215. As sidewalls 214 of upper cavities 208 may be convex or sloped, sidewalls 222 of lower cavities 215 may also be convex or sloped. Sidewalls 214 of cavities 208 coincide with sidewalls of upper portion 220 of conductors 219, whereas sidewalls 222 of lower cavities 215 coincide with the sidewalls of lower portion 221 of conductors 219. The profile of conductors 219 may resemble a pagoda-like structure. In some embodiments, conductors 219 may have an aspect ratio h3/w1 that is 2:1 or greater. Spacing s3 between conductors 219 may be the minimum distance between bases 223 of conductors 219. In some embodiments, conductors 219 are trace conductors extending lengthwise in the y direction (e.g., above and below the plane of the figure). In some embodiments, conductors 219 are vias or pillars. Structural aspects of conductors 219 are described below.

Figure 3A:
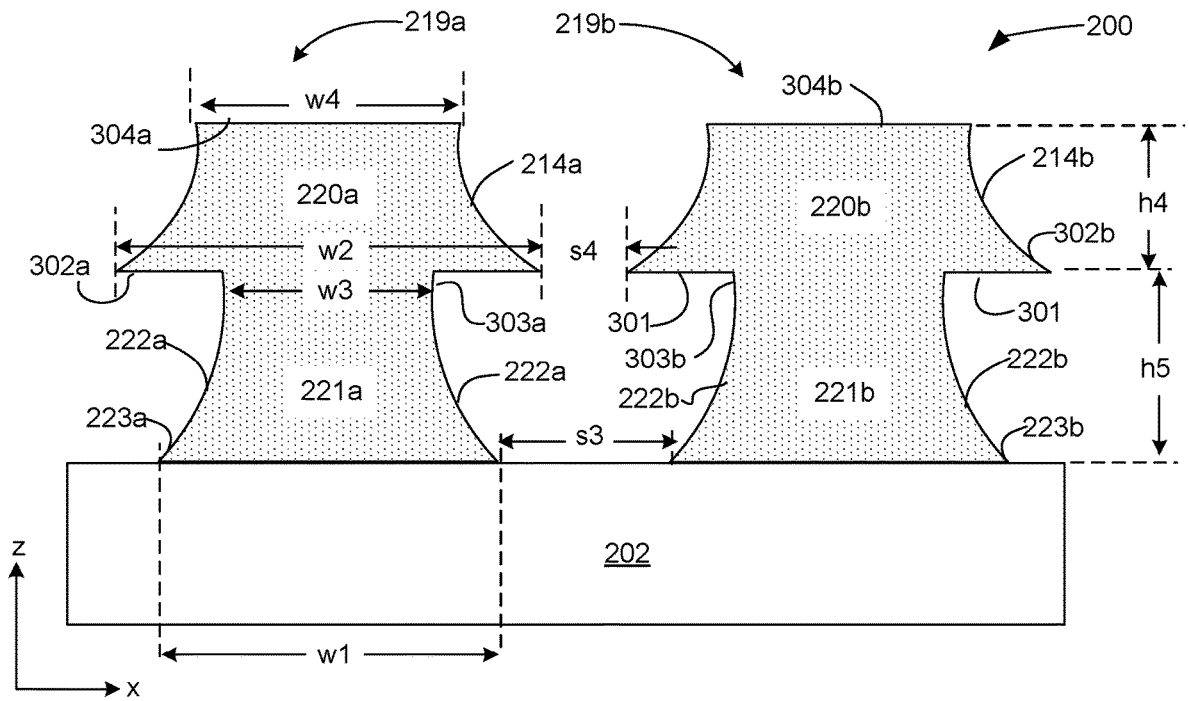
FIG. 3A illustrates a cross-sectional view in the x-z plane of high-aspect ratio thick conductors formed by a dual-step subtractive isotropic etch patterning of a thick copper layer on a package core, according to some embodiments of the disclosure.

FIG. 3A illustrates a cross-sectional view in the x-z plane of conductors 219a and 219b formed by a dual-step subtractive isotropic etch patterning of a thick copper layer on a package core, according to some embodiments of the disclosure.

FIG. 3A shows core 200, comprising conductors 219a and 219b on core substrate dielectric 202. In some embodiments, conductors 219a and 219b are substantially identical, comprising upper portions 220a and 220b over lower portions 221a and 221b, respectively. Upper portions 220a and 220b may have overhangs 301 extending over both sidewalls 222a/b of lower portions 221a/b. In some embodiments, both upper sidewalls 214a/b and lower sidewalls 222a/b may have a sloped and/or convex curvature, lending a pagoda-like resemblance to the profile of conductors 219a/b.

Lower portions 221a/b may have a width w1 of bases 223a/b, whereas upper portions 220a/b may have a width w2 of bases 302a/b. In some embodiments, width w1 is greater than width w2. Likewise, lower portions 221a/b have a width w3 of tops 303a/b, whereas upper portions 220a/b have a width w4 of tops 304a and 304b. In some embodiments, width w3 is less than or equal to w4. Upper portions 220a/b may have a z-height h4 that is less than or equal to the z-height h5 of lower portions 221a/b. In some embodiments, adjacent conductors 219a and 219b have a minimum spacing s3 between bases 223a and 223b of lower portions 221a/b and/or a minimum spacing s4 between bases 302a and 302b of upper portions 220a/b. In the illustrated embodiments, spacing s4 between bases 302a/b.

Figure 3B:
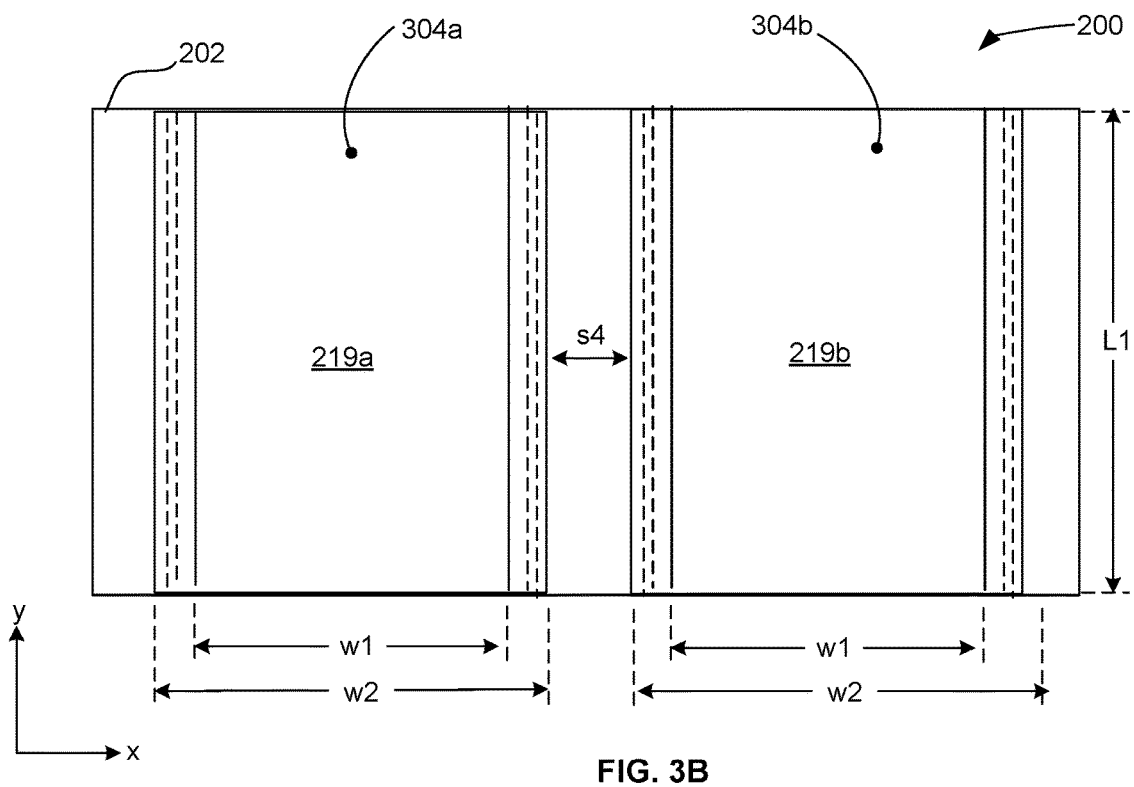
FIG. 3B illustrates a plan view in the x-y plane of a package core comprising high-aspect ratio thick conductors in a one-dimensional array of parallel traces formed by a dual-step subtractive isotropic etch patterning of a thick copper layers, according to some embodiments of the disclosure.
Figure 3C:
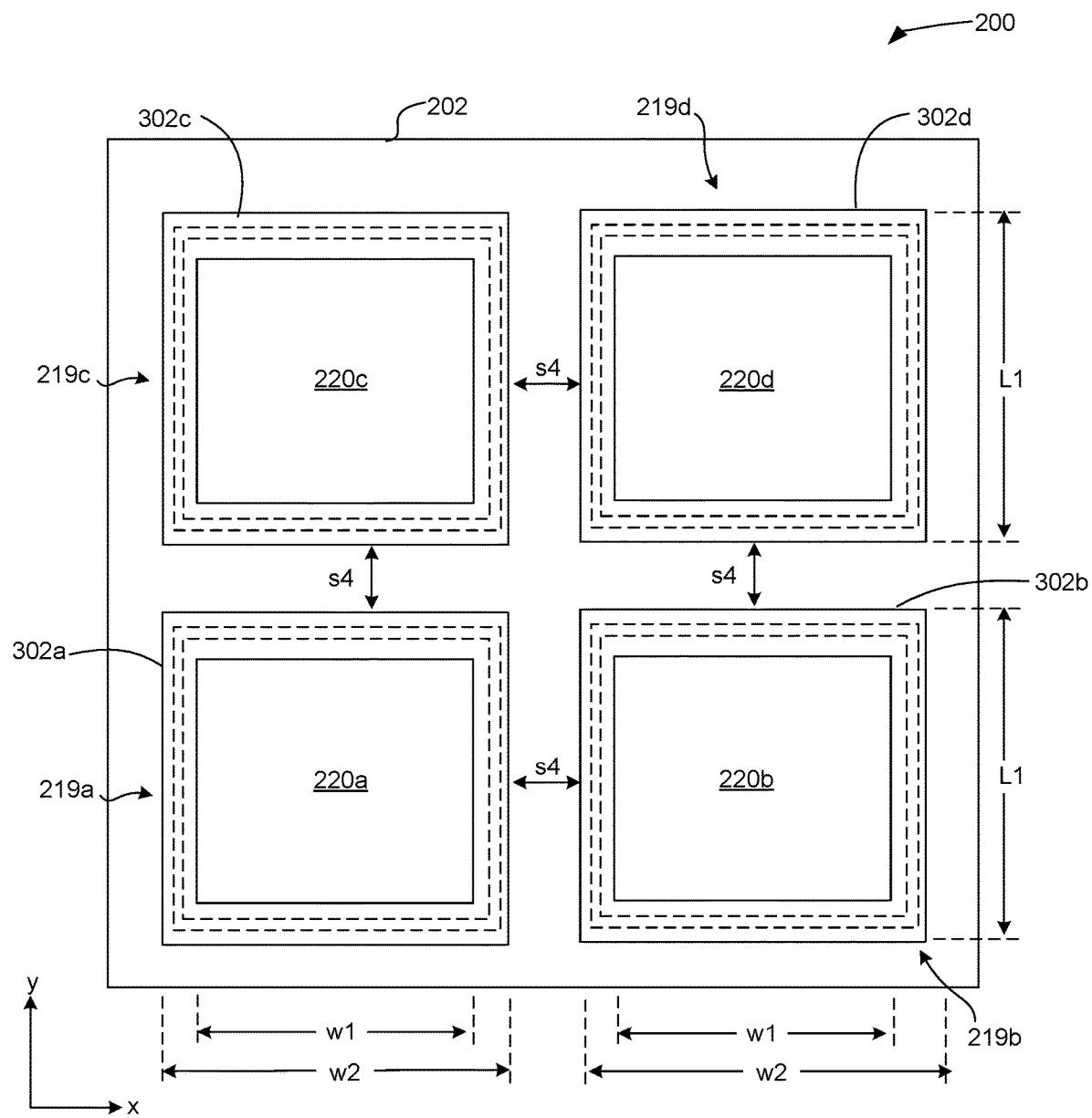
FIG. 3C illustrates a plan view in the x-y plane of a package core comprising high-aspect ratio thick conductors in a two-dimensional array of pillars formed by a dual-step subtractive isotropic etch patterning of a thick copper layers, according to some embodiments of the disclosure.
Figure 3D:
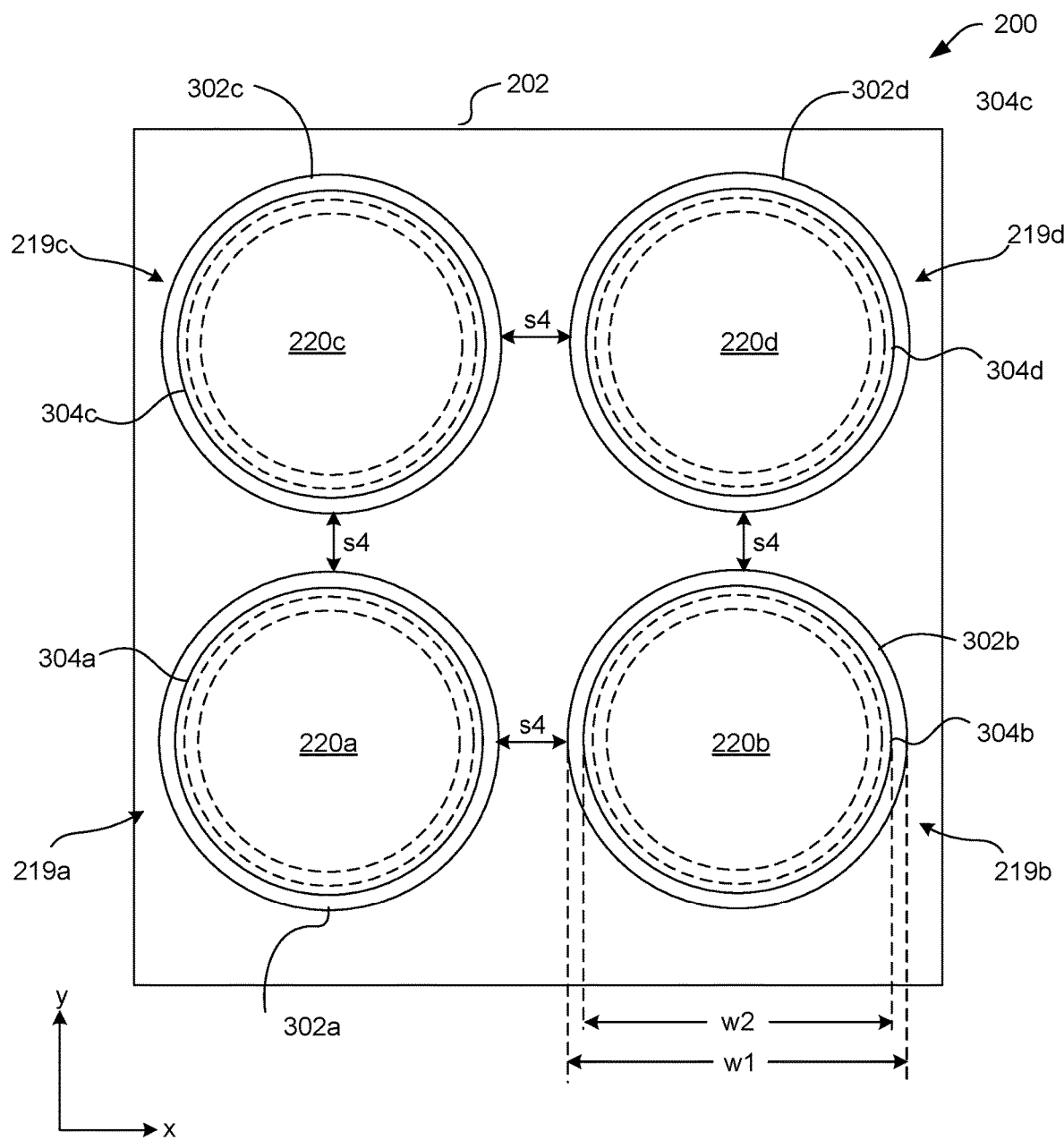
FIG. 3D illustrates a plan view in the x-y plane of a package core comprising high-aspect ratio thick conductors in a two-dimensional array of pads formed by a dual-step subtractive isotropic etch patterning of a thick copper layers, according to some embodiments of the disclosure.

FIGS. 3B, 3C and 3D respectively illustrate plan views in the x-y plane of core 200 comprising conductors 219 in a one-dimensional array of parallel traces or in a two-dimensional array of pillars and pads, formed by a dual-step subtractive isotropic etch patterning of a thick copper layers, according to some embodiments of the disclosure.

FIG. 3B shows a top view of adjacent conductors 219a and 219b, separated by minimal spacing s4, the distance between bases 302a and 302b of top portions 304a and 304b, respectively. Spacing s4 may be a minimal distance between adjacent conductors 219a and 219b. Conductors 219a/b have a length L1 extending in the y direction. In some embodiments, conductors 219a/b are parallel traces, where length L1 is many times width w1.

FIG. 3C shows a two-dimensional array of pillars comprising collocated high-aspect ratio conductors 219a-d having a rectangular perimeter. Each of conductors 219a-d may be substantially identical, each having a maximal width w1 at bases 302a-d. In some embodiments, length L1 is substantially equal to width w1. Collocated conductors 219a-d may be laterally (in the x-direction) and longitudinally (e.g., in the y-direction) separated by minimal spacing s4, the distance between the edges of bases 302a-d of top portions 220a-d.

FIG. 3D shows a two-dimensional array of pads comprising collocated conductors 219a-d, each having a circular perimeter. As shown for the rectangular pillars shown in FIG. 3C, conductors 219a-d may be substantially identical. Conductors 219a-d have top sections 220a-d, respectively. Each top section 220a-d has a maximal width w1 at bases 302a-d (of top sections 220a-d), and a minimal width w2 at tops 304a-d. Conductors 219a-d have a minimum separation distance s4, as the minimal spacing between bases 302a-d.

Figure 4:
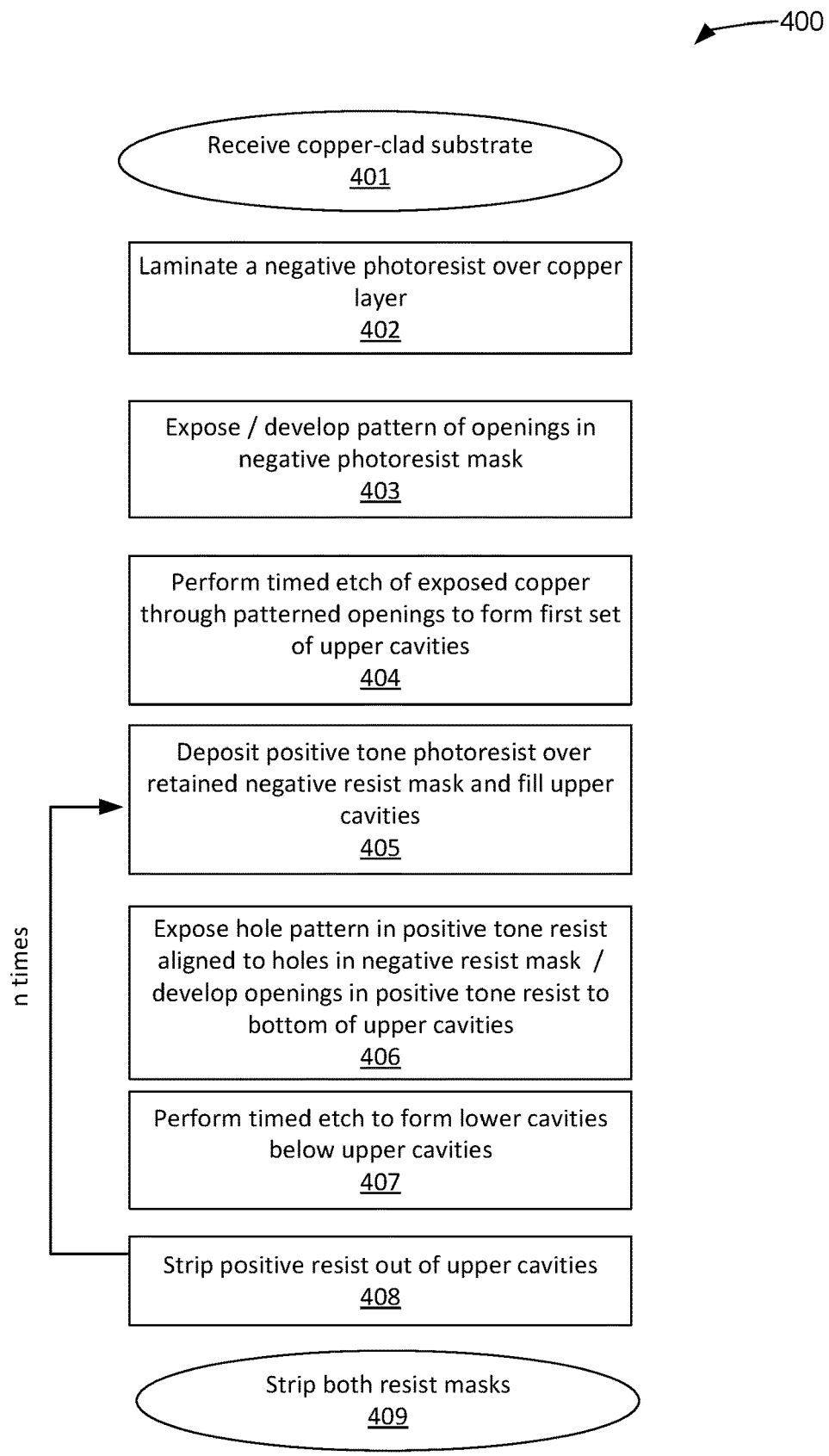
FIG. 4 presents a process flow chart summarizing an exemplary multiple subtractive etch process flow for the formation of high aspect-ratio conductors in thick copper layers, according to some embodiments of the disclosure.

FIG. 4 presents process flow chart 400, summarizing an exemplary multiple subtractive etch process flow for the formation of high aspect-ratio conductors in thick copper layers, according to some embodiments of the disclosure.

At operation 401, a copper-clad package core is introduced into a multiple subtractive etch process for patterning high-aspect ratio conductors on the core substrate. As noted above, the package core may comprise relatively thick unpatterned copper layers (e.g. 35 microns or greater), one on each side of the core dielectric. The package core may be one of multiple unsingulated package cores distributed on a core panel or wafer. The package core may be similar to the package core described in exemplary dual subtractive etch patterning process 100 described above.

Operations 402-404 may be substantially the same as operations 102-104 of process flow 100. Briefly, at operations 402 and 403, an etching mask is formed over the copper layer by lamination of a negative-tone photoresist patterned to form openings corresponding to spaces between conductors to be formed in subsequent etch operations. At operation 404, a first timed isotropic etch process is performed to open a first set of upper cavities at the surface of the copper layer.

At operation 405, a negative-tone or a positive tone liquid photoresist is deposited into the shallow cavities through openings in the negative-tone photoresist etch mask. The liquid photoresist may be applied by spin-coating, spray coating or electrodeposition to completely fill the cavities.

At operation 406, the liquid photoresist may be patterned to form secondary openings aligned at the centers of the primary openings in the negative-tone photoresist. As noted above, the negative-tone photoresist etch mask formed during operations 402-404 may be employed as a secondary etch mask to protect sidewalls of the first set of cavities formed in operation 404. The secondary openings may be aligned to the centers of the primary openings. In some embodiments, a second lithographic mask may not be needed for patterning a positive tone photoresist within the cavities. The initial resist pattern in the negative-tone photoresist etch mask may be employed as a contact mask positive tone photoresist may be illuminated by a flood exposure using the negative-tone photoresist etch mask as a contact mask, resulting in self alignment to the initial resist for self-alignment of the secondary openings formed in the positive-tone photoresist within the cavities during the second exposure. A bias (e.g., overhang) of the primary openings may shield positive-tone photoresist at the sidewalls of the cavities, leaving sidewalls protected from etching in subsequent operations.

At operation 407, a set of lower cavities is formed below the upper cavities formed at operation 404, by isotropically etching copper exposed through the secondary openings made in the positive-tone photoresist in the previous operation. The positive-tone photoresist may protect sidewalls of the upper cavities from further chemical attack by the etchant when forming lower cavities. At operation 408, the positive-tone photoresist is stripped out of the upper cavities.

By repeating operations 405-408 iteratively n times, as indicated by the flow arrow, a vertical succession of n cavities may be formed as a cavity stack. As vertical and lateral etch rates may be substantially similar, precise timing of each isotropic etch enables tight control of the lateral dimensions of each cavity. Earlier-formed cavities (e.g., the upper n cavities) in the cavity stack may be protected from further etching by coating the sidewalls of each upper cavity with the positive-tone photoresist in preparation for forming the next lower cavity. Each cavity may be etched to substantially the same depth by precise timing of the etch.

The depth of each cavity and thus the number of cavities may depend on the thickness of the copper layer and the desired width of the spacing between conductors. For example, each cavity may be etched to a depth of 10 microns or less. The width of the cavities may be approximately 10 microns or less, within an acceptable tolerance. The cavity width (e.g., 10 microns) may correspond to the spacing between adjacent conductors. For a 50 micron-thick copper layer, the number of iterations (n) of the etch cycle (e.g., operations 405-408) needed to completely etch spaces between each adjacent conductor is five. In this manner, high-aspect ratio conductors may be formed within a thick copper layer by conventional isotropic etching.

After formation of the nth cavity, the underlying substrate is exposed between each adjacent conductor. At this point, the process may terminate at operation 409 with removal of remaining positive-tone photoresist and the negative-tone photoresist etch mask, fully revealing the patterned conductors.

FIGS. 5A-5F illustrate cross-sectional views in the x-z plane of an exemplary method for forming high-aspect ratio conductive structures by multiple-step subtractive isotropic etch patterning of a thick copper layer, according to some embodiments of the disclosure.

Figure 5A:
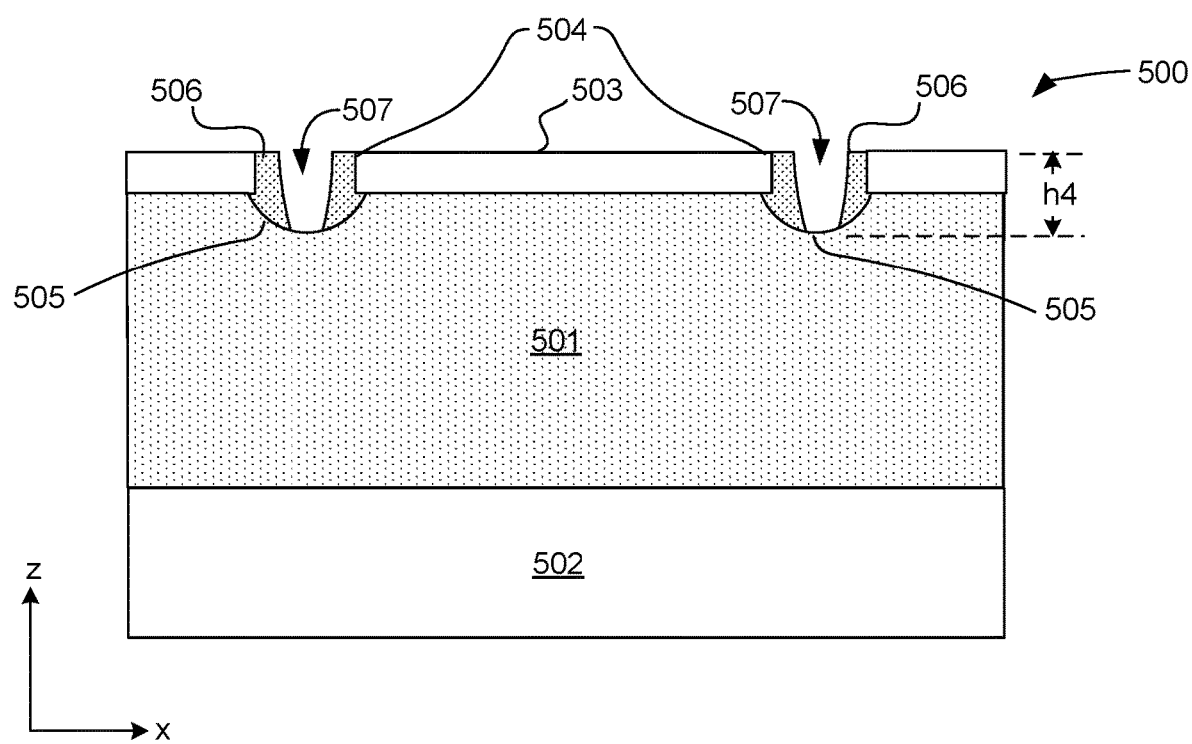
FIGS. 5A-5F illustrate cross-sectional views in the x-z plane of an exemplary method for forming high-aspect ratio conductive structures by multiple-step subtractive isotropic etch patterning of a thick copper layer, according to some embodiments of the disclosure.

In the operation shown in FIG. 5A, package core 500 comprising copper layer 501 on dielectric substrate 502 is covered by patterned negative-tone photoresist mask 503 comprising primary openings 504. Below primary openings 504 are first-level cavities 505 formed by an earlier isotropic copper etch at the surface of copper layer 501. First-level cavities 505 are filled with positive-tone photoresist 506, pattered with secondary openings 507 centered within primary openings 504.

Figure 5B:
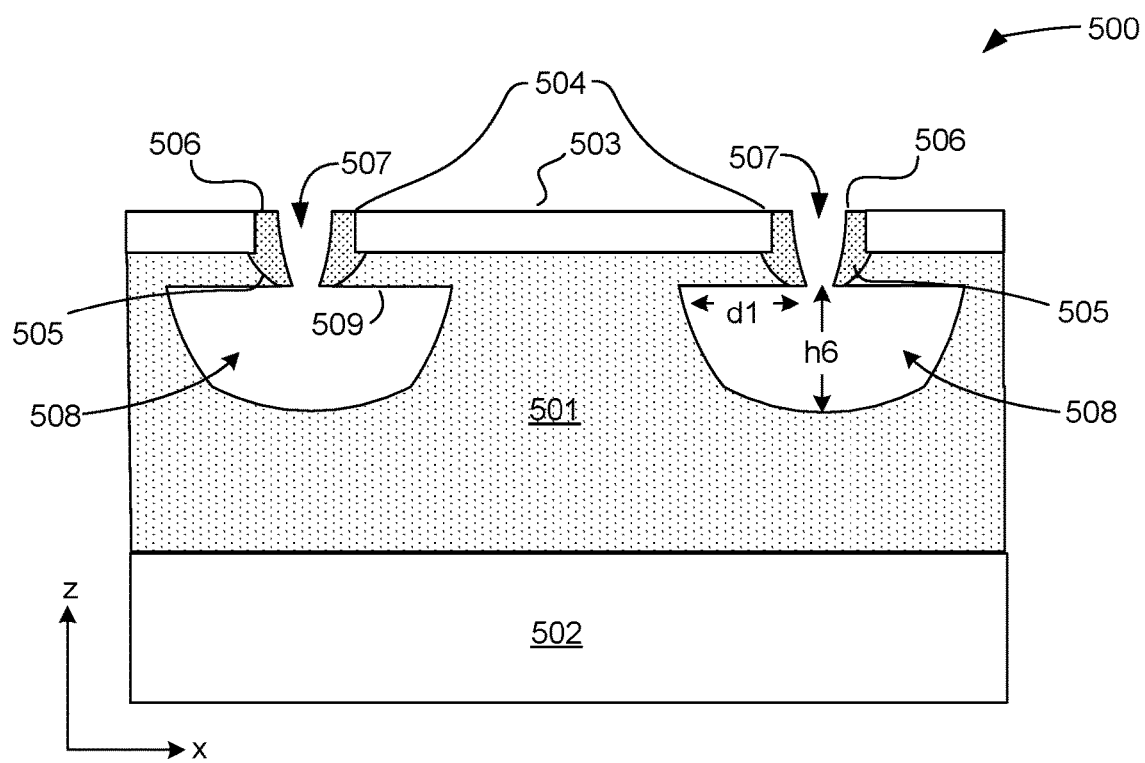

In the operation shown in FIG. 5B, second level cavities 508 are etched below first-level cavities 505. First-level cavities 505 may be the top cavities in a multi-step subtractive etch sequence. Second level cavities 508 may be etched to a depth h6 by etchant entering through openings 507. The etch may proceed laterally at a rate that may be similar to the vertical etch rate, producing an undercut extending a distance dl that is approximately equal to depth h6 of second level cavities 508. The undercut of second-level cavities 508 forms overhang 509.

Figure 5C:
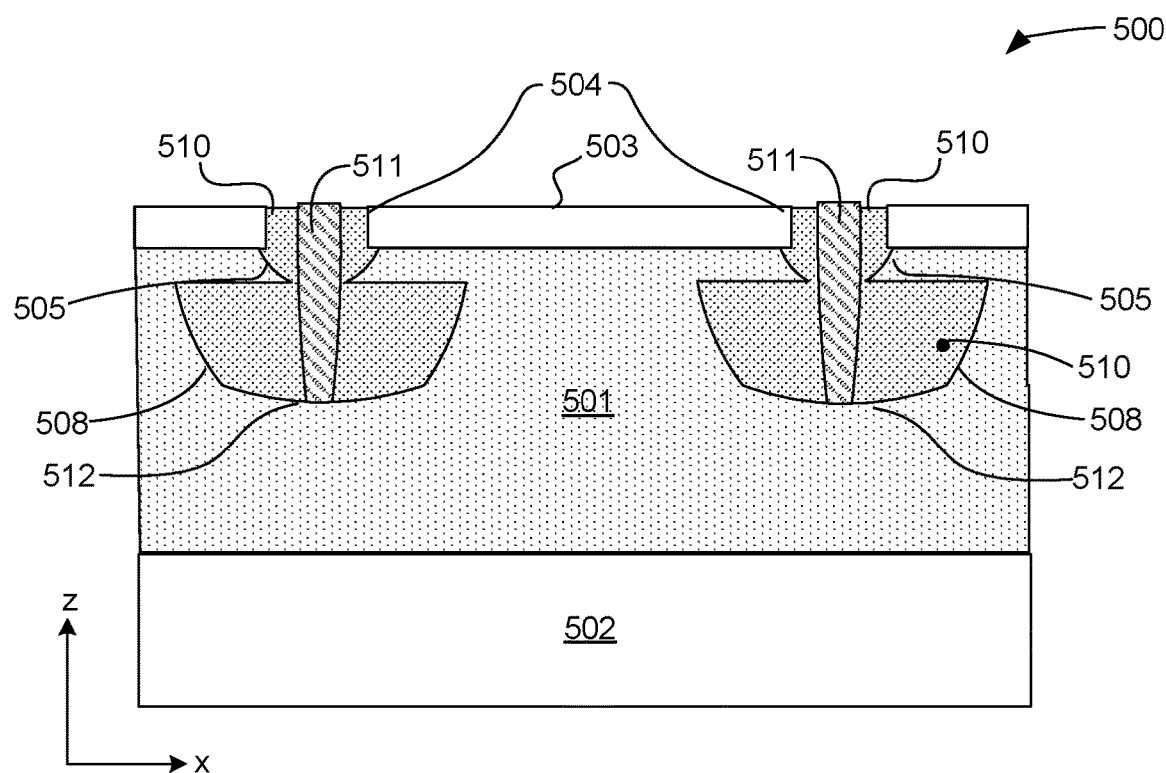

In the operation shown in FIG. 5C, positive-tone photoresist 506 within first level cavities 504 and second-level cavities 508 has been removed to refill both upper cavities 504 and second-level cavities 508 with fresh positive-tone resist 510. Positive-tone photoresist 510 is subsequently illuminated with UV light in a second lithographic operation (e.g., a flood exposure as described above), producing exposed regions 511 that extend to floors 512 of second-level cavities 508. Exposed regions 511 may be self-aligned to centers of openings 504 in negative-tone photoresist 503. A bias (e.g., overhang) of the primary openings may shield positive-tone photoresist at the sidewalls of the cavities from UV exposure, leaving sidewalls protected from etching in subsequent operations.

Figure 5D:
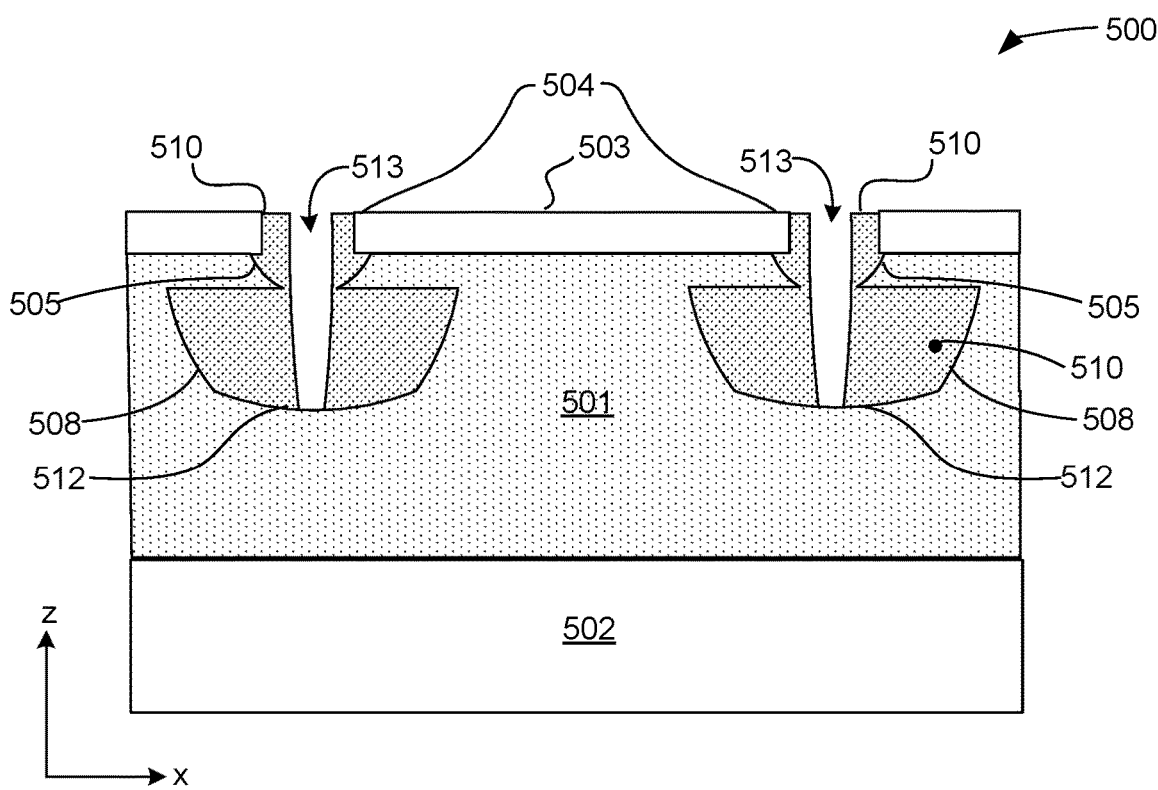
Figure 5E:
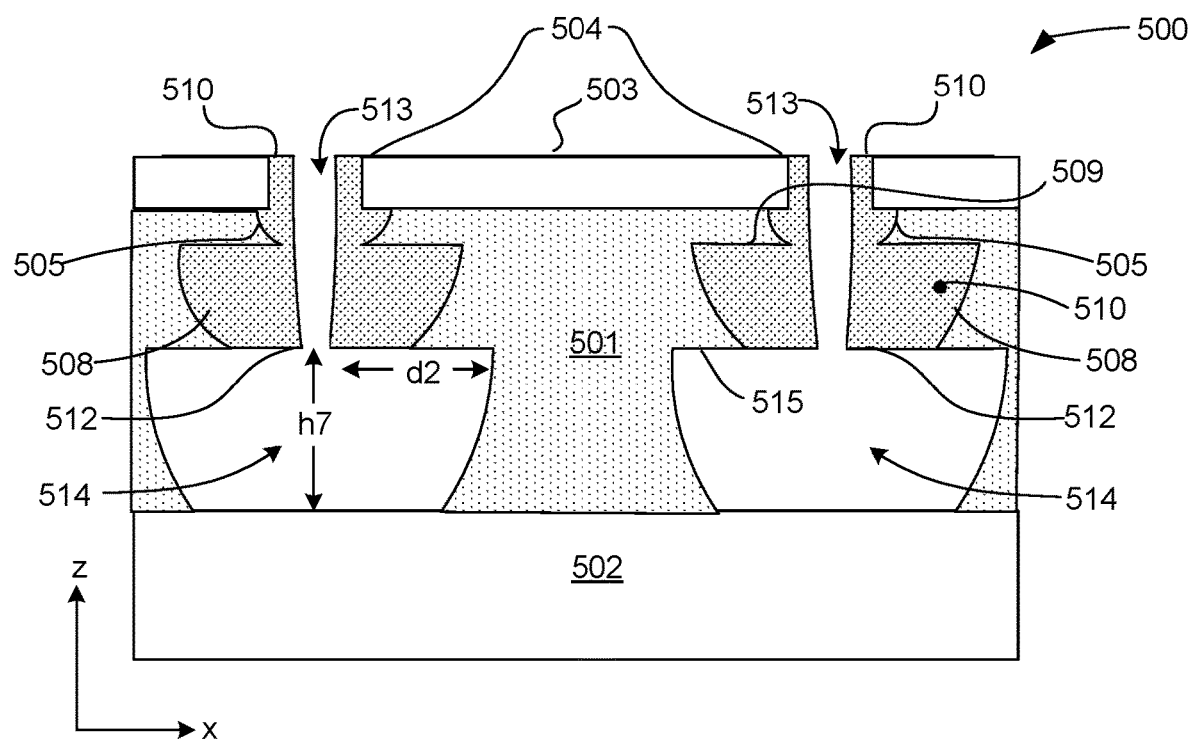

In the operation shown in FIG. 5D, material from exposed regions 511 of positive-tone photoresist 510, forming secondary openings 513. Portions of floors 512 of second-level cavities 508 are exposed at the bottoms of secondary openings 513. In the operation shown in FIG. 5E, third-level cavities 514 are formed below second-level cavities 508 in a third isotropic subtractive etch. Third-level cavities 514 may be etched to a depth h7 that may be equal to or greater than depth h6 of second-level cavities 508. Third-level cavities 514 may have an undercut that may extend a distance d2, forming overhang 515. Undercut distance d2 may be substantially equal to or greater than distance d1 of second-level cavities 508.

Figure 5F:
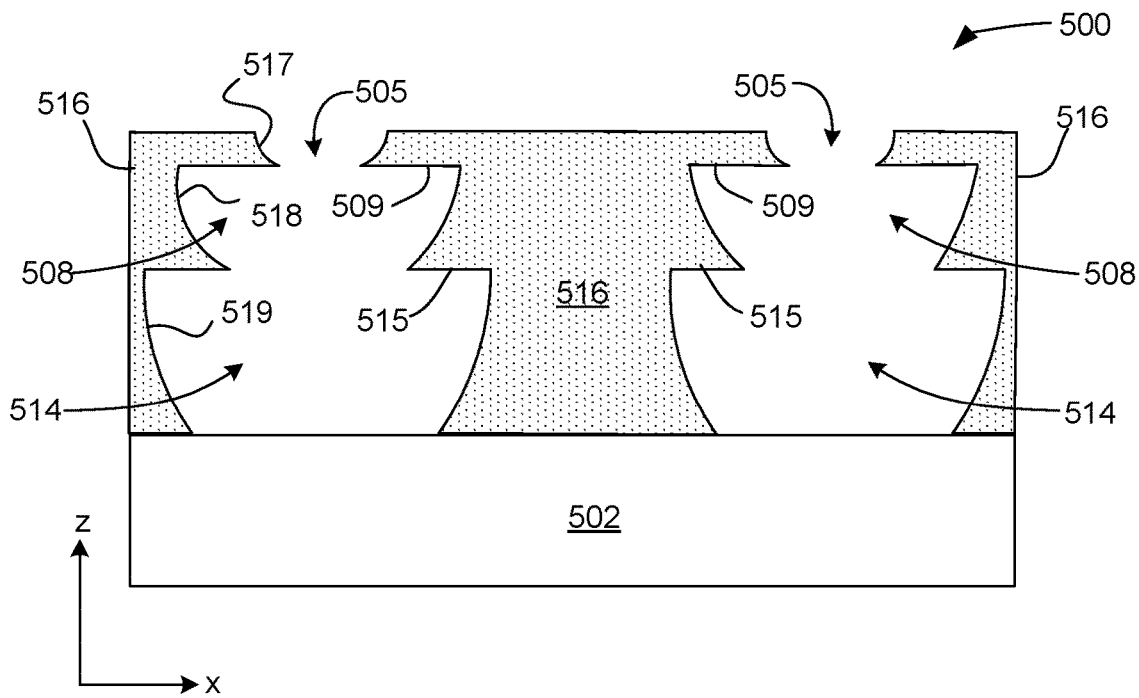

In the operation shown in FIG. 5F, negative-tone photoresist 503 and positive tone photoresist 510 are removed from core 500 by a stripping operation, revealing three-tiered conductors 516. Outlines of first, second and third level cavities 504, 508 and 514 form sloped and/or convex sidewalls 517, 518 and 519, respectively, of conductors 516. Structural features of conductors 516 are described below.

Figure 6:
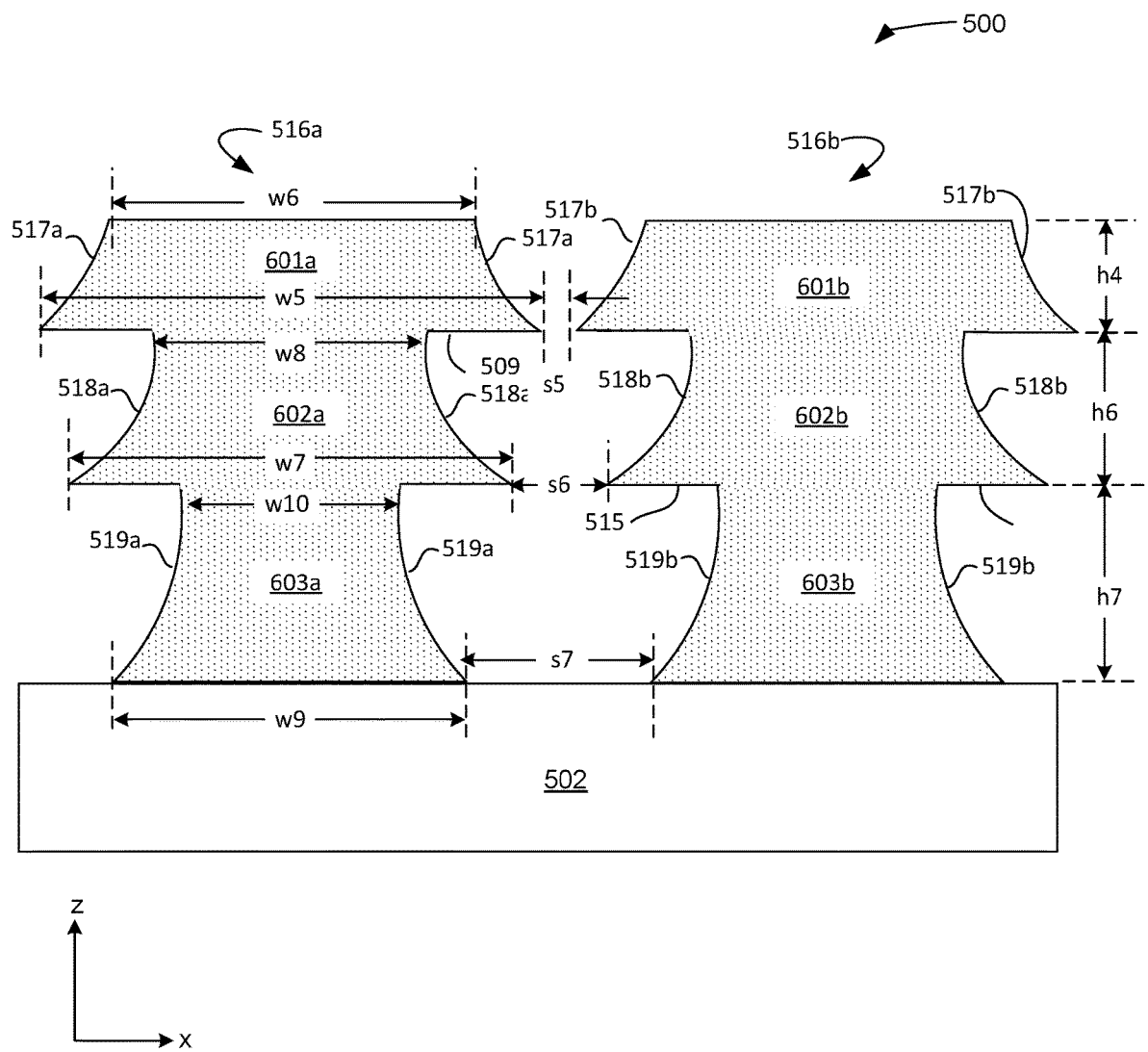
FIG. 6 illustrates a cross-sectional view in the x-z plane of high-aspect ratio thick conductors formed by a multi-step isotropic etch on a package core, according to some embodiments of the disclosure.

FIG. 6 illustrates a cross-sectional view in the x-z plane of conductors 516 formed by a multi-step isotropic etch on package core 500, according to some embodiments of the disclosure.

Conductors 516a and 516b are shown as adjacent structures on core substrate 502, and may be adjacent parallel trace conductors in an array of multiple identical parallel traces. In some embodiments, conductors 516a and 516b are collocated pillars or vias. Conductors 516a-b comprise upper portions 601a/b bounded by sidewalls 517a/b, mid-level portions 602a/b bounded by sidewalls 518a/b below upper portions 601a/b, and lower portions 603a/b bounded by sidewalls 519a/b below mid-level portions 602a/b.

Sidewalls 517a/b, 518a/b and 519a/b may be tapered and/or convex. In the illustrated embodiment, upper, mid-level and lower portions 601a/b, 602a/b, 603a/b, respectively, have progressively narrower top widths w6, w8, w10, respectively, (e.g., w6>w8>w10) and progressively narrower base widths w5, w7 and w9, respectively (e.g., w5>w7>w9). In some embodiments, top widths w6, w8 and w9, as well as bottom widths w5, w7 and w9 may be substantially equal.

In the illustrated embodiment, upper portions 601a/b have a z-height h4 (e.g., corresponding to depth h4 of first-level cavities 504, FIG. 5A). Mid-level portions 602a/b have a z-height h6 (e.g., corresponding to depth h6 of second level cavities 508, FIG. 5B). Lower portions 603a/b have a z-height h7 (e.g., corresponding to depth h7 of third-level cavities 514, FIG. 5E). In the illustrated embodiment, z-heights h4, h6 and h7 are progressively larger (e.g., h7>h6>h4). Z-heights of portions 601-603a/b may be adjustable by adjusting the timing of each etch step of the multi-step isotropic etch process to form the cavity stack (e.g., comprising cavities 504, 508 and 514). In some embodiments, z-heights h4, h6 and h7 are substantially equal.

Bottom widths w5, w7 and w9, as well as top widths w6, w8 and w10 of upper, mid-level and lower portions 601a/b -603a/b. respectively, are shown to be progressively narrower in the illustrated embodiment. By similar adjustments of etch timing of the multi-step isotropic etch process, bottom widths w5, w7 and w9 may be substantially equal. Minimal spacings s5, s6 and s7 between upper, mid-level and lower portions 601a/b 602a/b and 603a/b may be determined in part by base widths w5, s7 and w9, respectively. In the illustrated embodiment, conductors 516a and 516b may have a minimum spacing distance s5 between upper portions 601a/b.

Conductors 516a and 516b may have an aspect ratio that is the overall z-height to maximal width. For example, the aspect ratio of conductors 516a and 516b may be (h4+h6+h7)/w5.

Figure 7A:
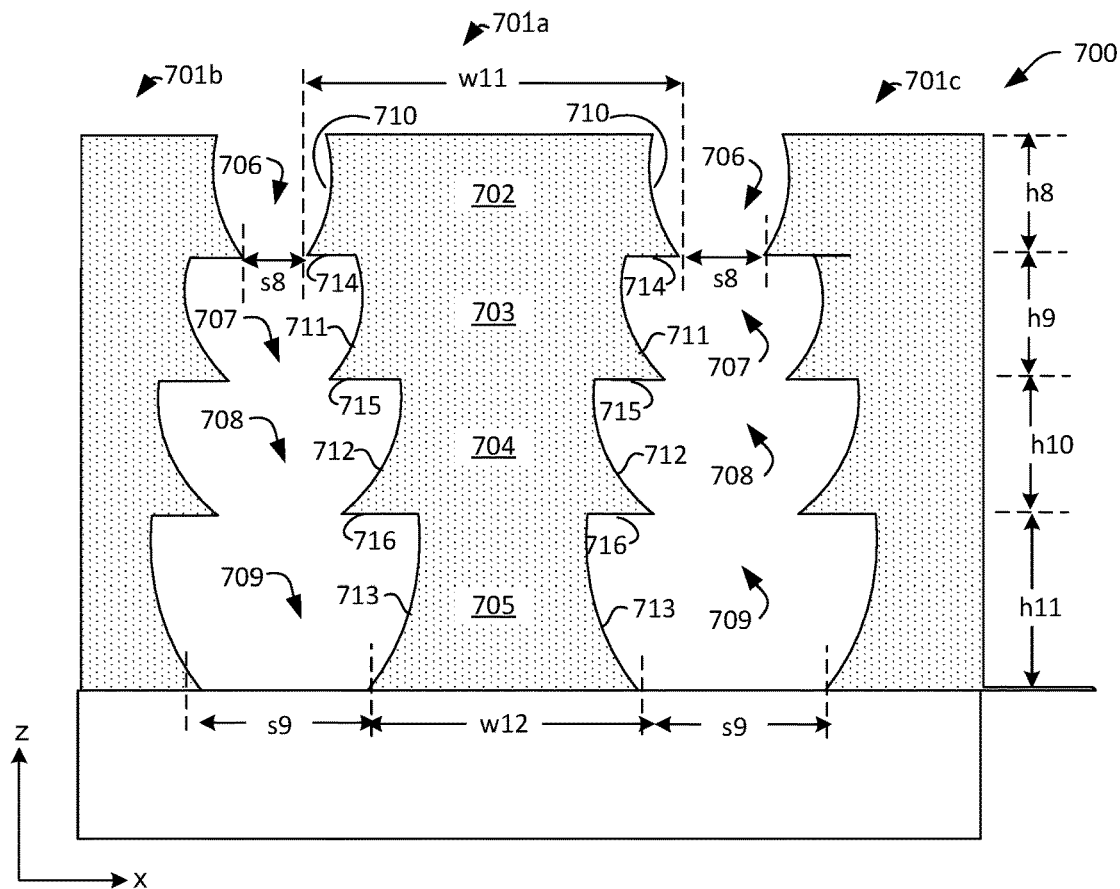
FIG. 7A illustrates a cross-sectional view in the x-z plane of high-aspect ratio thick conductors formed by a multi-step isotropic etch on a package core, according to some embodiments of the disclosure.

FIG. 7A illustrates a cross-sectional view in the x-z plane of high-aspect ratio conductors 701 formed by a multi-step isotropic etch on package core 700, according to some embodiments of the disclosure.

In FIG. 7A, an array of high-aspect ratio conductors 701 is shown. While the following description is directed to a single conductor 701a, adjacent conductors (e.g., conductors 701b and 701c) within the array may also be substantially described. In the illustrated embodiment, conductors 701 comprise a stack of four portions 702, 703 704 and 705 (in descending order), arranged in a in a stack similar to portions 601-603 of conductors 516a and 516b. The four portions 702-705 may be adjacent to cavities 706, 707, 708, and 709, formed by a four-step isotropic etch process, according to some embodiments.

Portions 702-705 have z-heights h8, h9, h10 and h11, respectively. Z-heights h8-h11 may increase progressively, according to some embodiments. Conductor 701a has an overall taper as a result of progressively narrower base widths of each portion from top to bottom. For example, portion 702 at the top of conductor 701a has a base width w12, whereas portion 705 at the bottom of conductor 701a has a base width w11 that is smaller than width w12. Base width w12 may be the maximal width of conductor 701a, whereas base width w11 may be the minimal width of conductor 701a.

Each portion 702-705 has sidewalls 710, 711, 712 and 713, respectively, that are tapered and/or convex. At the base of each portion, overhangs 714, 715 and 716 extend over sidewalls 711, 712 and 713, respectively, forming a pagoda-like profile (cross-section) of conductor 701a. By forming a stack of four portions, conductor 701a may have a larger aspect ratio (height/width) than a three-portion stack (e.g., conductor 516) or a two-portion stack (e.g., conductor 219).

For example, conductor 701a has an aspect ratio comprising the sum of the z-heights of each portion (h8+h9+h10+h11) over the maximal width w12.

A minimal spacing s8 may be between adjacent conductors 701a, 701b and 701c. The minimal spacing s8 may at the top of conductors 701a-c, coinciding with base width w11 of top portions 702. Maximal spacing s9 may be between adjacent bottom portions 705, coinciding with base width w12 of bottom portions 705. Minimal spacing s8 and maximal spacing s9 may be adjusted by adjusting the timing of the multi-step isotropic etch when forming each of cavities 706-709. For example, minimal spacing s8 may be adjusted to be 10 microns or less between adjacent conductors 701a, 701b and 701c.

Figure 7B:
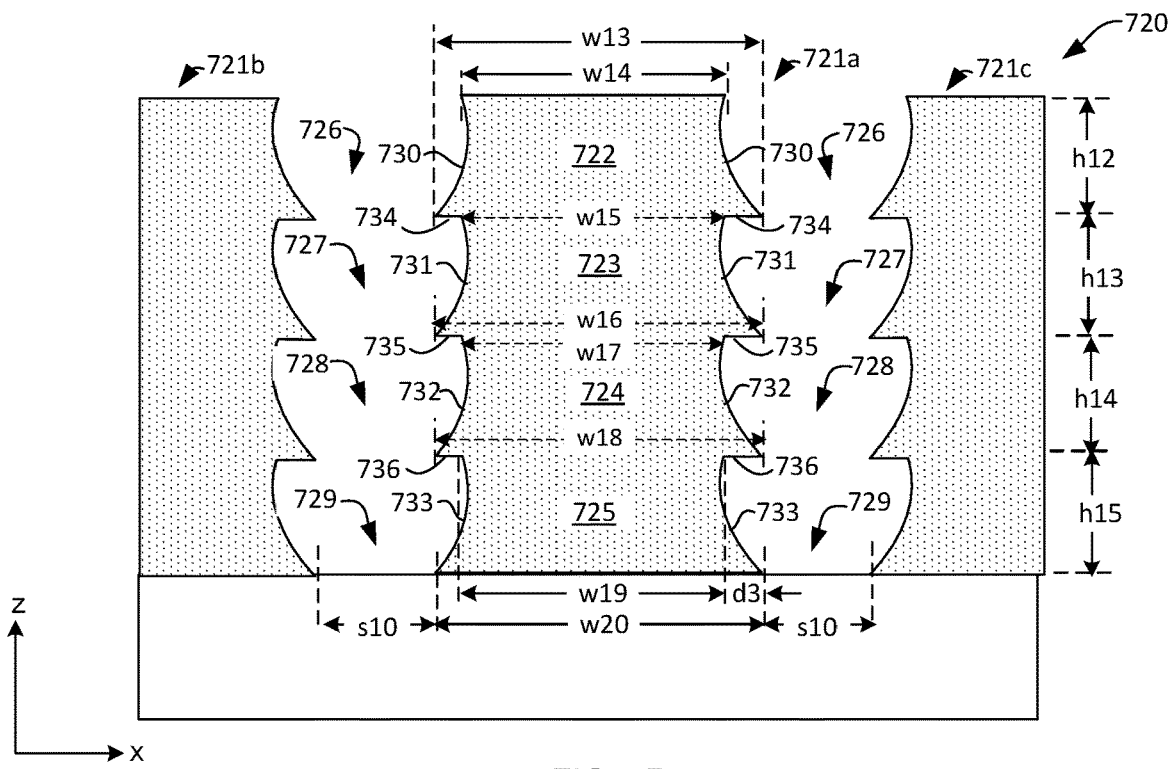
FIG. 7B illustrates a cross-sectional view in the x-z plane of high-aspect ratio thick conductors formed by a multi-sept isotropic etch on a package core, according to some embodiments of the disclosure.

FIG. 7B illustrates a cross-sectional view in the x-z plane of high-aspect ratio conductors 721 formed by a multi-sept isotropic etch on package core 720, according to some embodiments of the disclosure.

In the illustrated embodiment of FIG. 7B, an array of high-aspect ratio conductors 721 is shown. While the following description is directed to a single conductor 721a, adjacent conductors (e.g., conductors 721b and 721c) within the array may also be substantially described. Conductors 721 comprise a stack of four portions, first-level portion 722, second-level portion 723, third-level portion 724 and fourth-level portion 725 (in descending order), similar to conductors 701 shown in FIG. 7A. Portions 722-725 have substantially equal top widths w14, w15, w17 and w19, respectively, as shown. Likewise, portions 722-725 have substantially equal bottom widths w13, w16, w18 and w20, respectively, as shown. Portions 722-725 comprise sidewalls 730, 731, 732 and 733, respectively, adjacent to cavities 726, 727, 728 and 729, respectively. In the illustrated embodiment, sidewalls 730-733 are tapered and/or convex. Overhangs 734, 735 and 736 may extend over sidewalls 730-733 by a distance d3. Spacing s10 between overhangs 734-736 on adjacent conductors 721b and 721c may be a minimal distance between adjacent conductors 701a and 701b and between 701a and 701c.

Sidewalls of cavities 726-729 may coincide with sidewalls 730-733, respectively. In the illustrated embodiment, cavities 726-729 have substantially the same dimensions. For example, cavity z-heights h12, h13, h14 and h15 are substantially the same. Portions 722-725 of conductors 721 may also have z-heights that are substantially equal to z-heights h12-h15 of cavities 726-729, respectively. may also be substantially the z-heights of each, respectively.

Cavities 726-729 may be formed in succession by a multi-step subtractive isotropic etch, whereby the etch at each level is timed to produce substantially identical cavities at each level. As a consequence, portions 722-725 may be substantially identical. For example, as noted above, top widths w14, w15, w17, and w19 may be substantially equal. Likewise, bottom widths w13, w16, w18 and w20 may be substantially equal. Due to the substantially similar widths for each portion 722-725, conductors 721 may have non-tapered profiles.

Figure 8A:
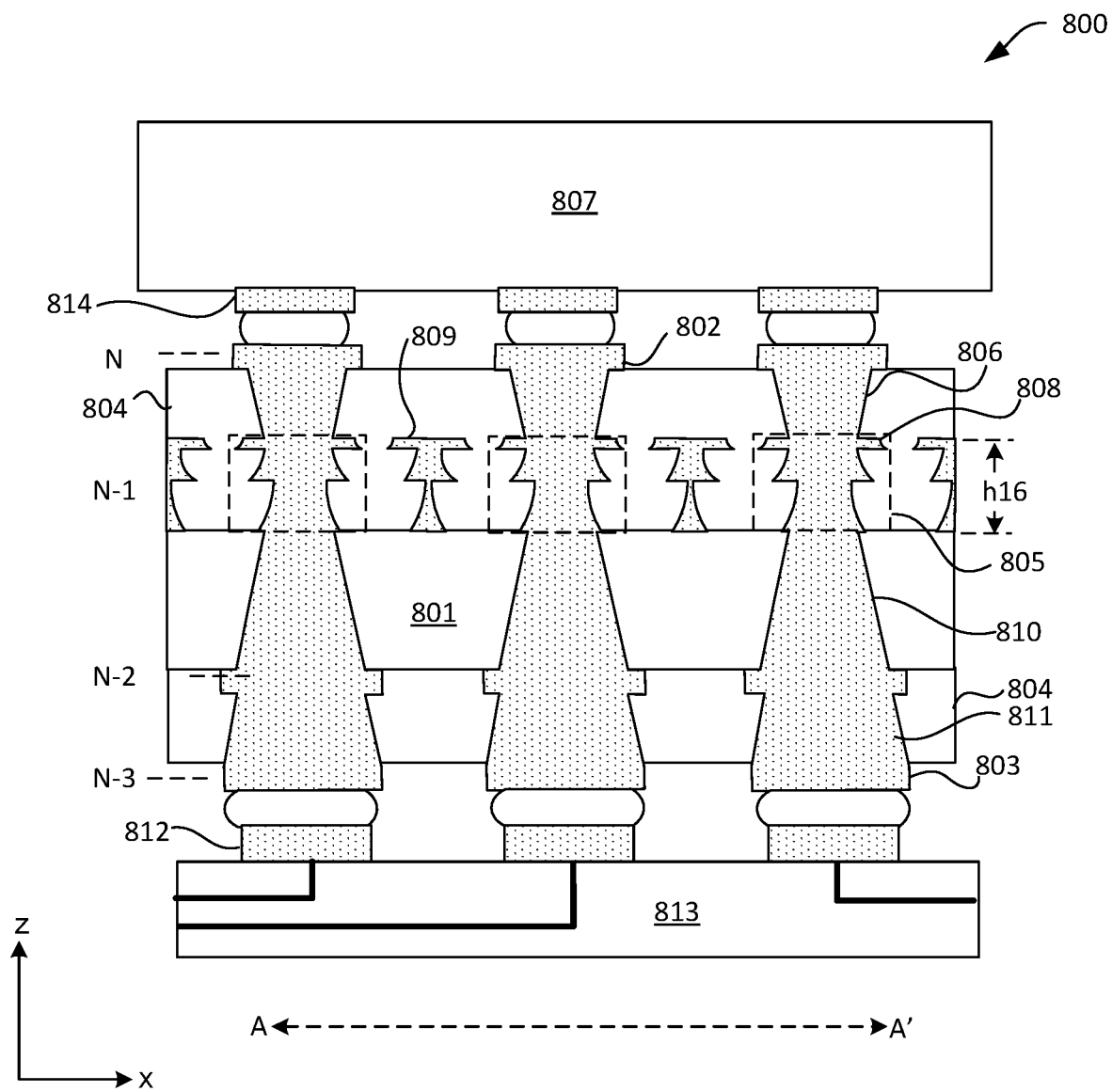
FIG. 8A illustrates a cross-sectional view in the x-z plane of a cored IC package comprising an IC die coupled to high-aspect ratio thick conductors on a package core, according to some embodiments of the disclosure.

FIG. 8A illustrates a cross-sectional view in the x-z plane of cored IC package 800, comprising IC die 801 coupled to high-aspect ratio conductors 805 on package core 801, according to some embodiments of the disclosure.

Figure 8B:
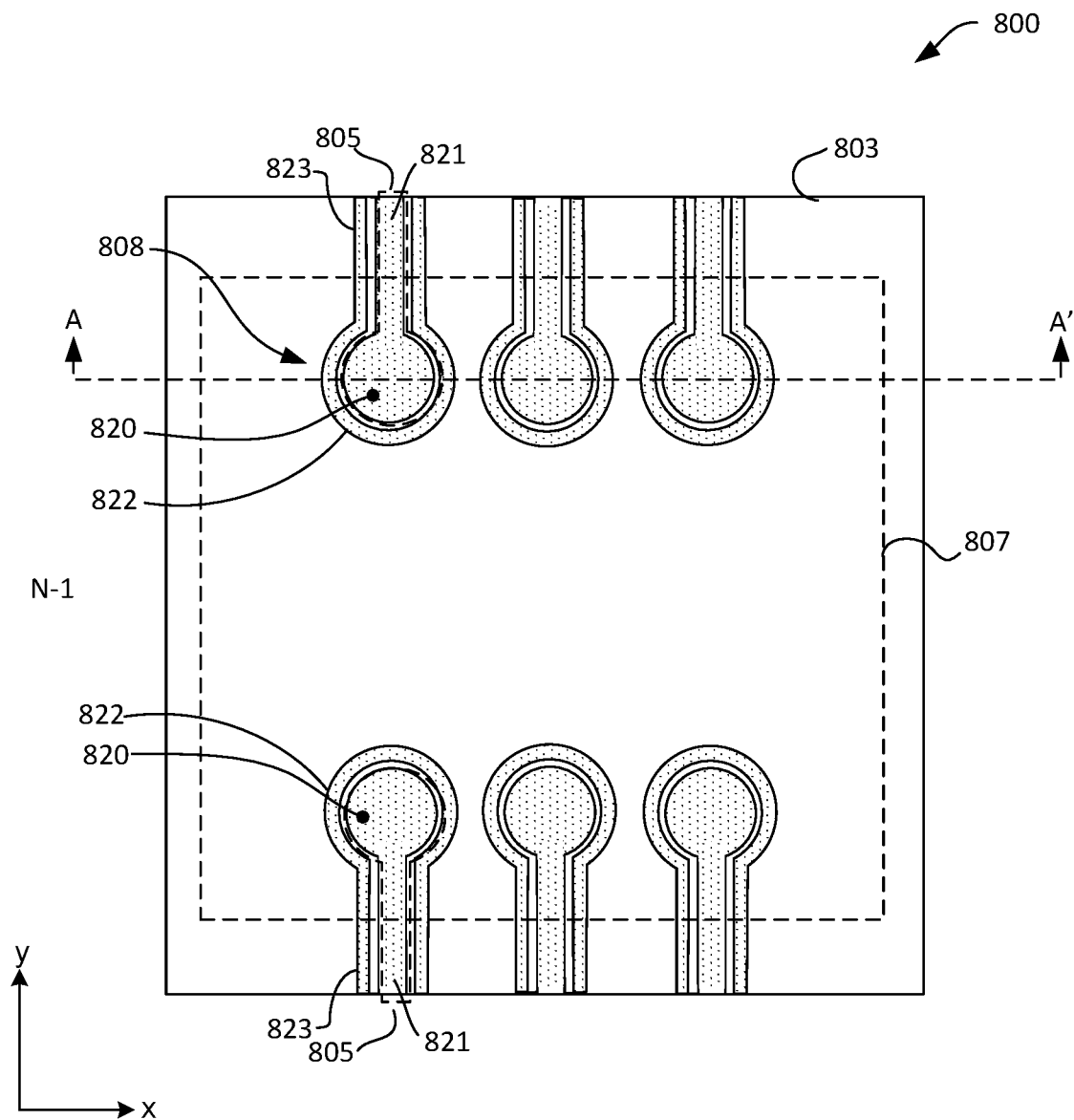
FIG. 8B illustrates a plan view in the x-y plane of an IC package at metallization plane N-1, showing an implementation of high-aspect ratio thick conductors, according to some embodiments of the disclosure.

In FIG. 8A, the cross-sectional view is through x-z plane A-A' shown in FIG. 8B, cutting IC package 800 through landing pads 810. IC package 800 comprises core 801 and four metallization planes, labelled N, N-1, N-2 and N-3. In descending order in the vertical metallization stack, metallization planes N and N-1 are shown above core 801, whereas metallization planes N-2 and N-3 are below core 801. Metallization plane N is the die-side (e.g., top) metallization level of the metallization stack comprising to die-side interconnects 802. Metallization plane N-3 is on the land side (e.g., bottom) level of the metallization stack comprising land interconnects 803. Metallization planes N-1 and N-2 are embedded within dielectric 804, immediately adjacent to core 801 on opposite sides. Metallization plane N-1 comprises high-aspect ratio conductors 805, formed by a multi-step subtractive isotropic etch process, (e.g., described above and shown in FIGS. 5A-5F).

Conductors 805, shown enclosed in dashed rectangles, may be substantially similar to high-aspect ratio conductors 516 shown in FIG. 6. In the illustrated embodiment, conductors 805 may be arranged as an array of parallel traces (e.g., power traces 821 shown in FIG. 8B) electrically coupled to landing pads (e.g., pads 820 in FIG. 8B) within metallization plane N-1. In some embodiments, conductors 805 extend vertically (in the z-direction) through dielectric 804 from core 801 to vias 806. Vias 806 may be formed on top of landing pads (e.g., pads 820 in FIG. 8B), extending between metallization planes N-1 and N. Conductors 805 may thereby be contiguous with and electrically coupled to vias 806. IC die 807 is coupled to conductors 805 through die-side power interconnect pads 802 that are integral with vias 806 extending from top portions 808 of conductors 805.

As noted above, conductors 805 may be power traces and/or landing pads (e.g., landing pads 820 in FIG. 8B) in the illustrated embodiment. In some embodiments, conductors have a z-height h16 of 35 microns or greater. Vias 806 may be power vias having a large cross-sectional area. Conductors 805 may have an aspect ratio (z-height to width) greater than 1:1. For example, conductors 805 may have a z-height of 50 microns and a maximum width (e.g., width w5 in FIG. 6) of 30 microns. In the exemplary implementation, conductors 805 may have an aspect ratio greater than 1:1, enabling implementation of thick power traces arranged into high-density power routing. In the illustrated embodiment, conductors 805 are flanked by adjacent structures 809. Adjacent structures 809 may be guard rings 820 and/or guard traces 821, shown in FIG. 8B encircling or flanking conductors 805. Adjacent structures 809 may be formed simultaneously with conductors 805 during a multi-step subtractive isotropic etch process Conductors 805 are coupled to land interconnect pads 803 on the land side of core 801 by vias 810 extended through core 801 and coupled to vias 811 extending through dielectric 804. Land interconnect pads 803 may be coupled to power interconnect pads 812 on printed circuit board (PCB) 813. In the illustrated embodiment, power may be routed to IC die 807 from a power supply (not shown) on PCB 813 through via stacks comprising vias 811, 810 through core 801 to conductors 805 above core 801, coupling to power routed from PCB 813 to conductors 805 from below. Vias 806 may vertically couple power from conductors 805 to die-side interconnect pads 802 on the die side of dielectric 804.

FIG. 8B illustrates a plan view in the x-y plane of package 800 at metallization plane N-1, showing an implementation of high-aspect ratio thick conductors 805, according to some embodiments of the disclosure.

The plan view in FIG. 8B shows an exemplary implementation of conductors 805 comprising pads 820 contiguous with traces 821 within metallization plane N-1. Conductors 805 are indicated by the dashed outlines. Pads 820 may be landing pads for vias 806, arranged in a 3×3 array that may be matched to power interconnects 814 within a ball grid array of IC die 807. The footprint of IC die 807 is indicted by the dashed rectangular outline encompassing pads 820. Traces 821 are contiguous with pads 820, extending in the y-direction of the figure, for example as power routing within metallization plane N-1. In the illustrated embodiment, adjacent structures 808, shown in FIG. 8A, comprise guard rings 822 that may encircle pads 820 and electrically join guard traces 823 that flank traces 821. In an exemplary device implementation, guard rings 822 and guard traces 823 may be coupled to ground to reduce noise coupling within the power net of IC package 800.

Figure 9:
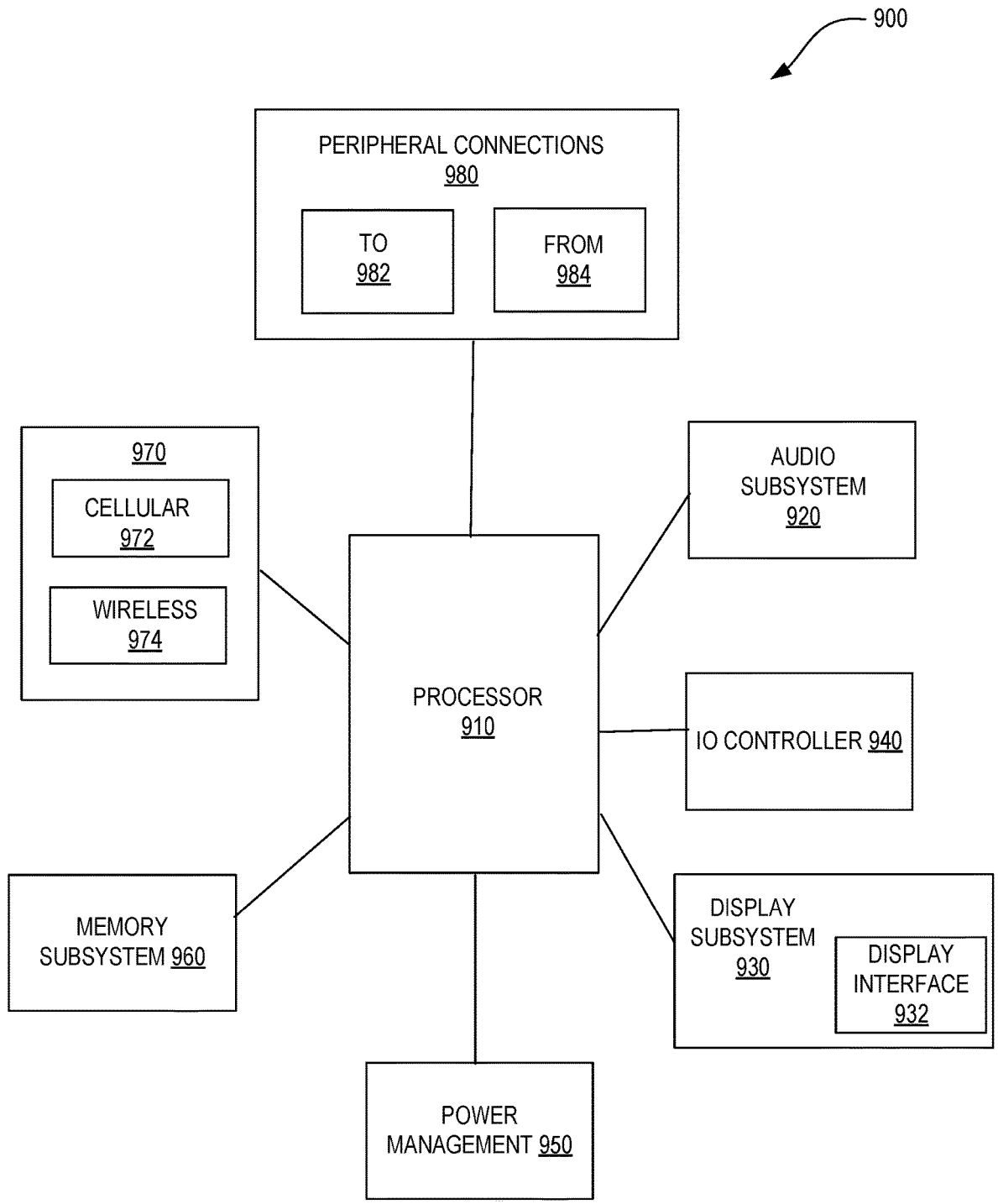
FIG. 9 illustrates a block diagram of a computing device as part of a system-on-chip (SoC) package in an implementation of high-speed serial and parallel memory I/O interface controllers coupled to high-speed serial interface I/O routing on a mixed-dielectric PCB comprising one or more mixed dielectric layers, according to some embodiments of the disclosure.

FIG. 9 illustrates a block diagram of computing device 900 as part of a system-on-chip (SoC) package in an implementation of high-aspect ratio power conductors formed by a multi-step subtractive isotropic etch process, according to some embodiments of the disclosure.

According to some embodiments, computing device 900 represents a server, a desktop workstation, or a mobile workstation, such as, but not limited to, a laptop computer, a computing tablet, a mobile phone or smart-phone, a wireless-enabled e-reader, or other wireless mobile device. Multichip IC packages, such as, but not limited to, a single- or multi-core microprocessor (e.g., representing a central processing unit), logic dies, RF dies, high power dies, memory dies, antenna dies, comprises a packages substrate having high-aspect ratio conductors (e.g., any of conductors 219, 516, 701, 721 or 805 described in this disclosure, for example).

In some embodiments, computing device has wireless connectivity (e.g., Bluetooth, WiFi and 5G network). It will be understood that certain components are shown generally, and not all components of such a device are shown in computing device 900.

The various embodiments of the present disclosure may also comprise a network interface within 970 such as a wireless interface so that a system embodiment may be incorporated into a wireless device, for example, cell phone or personal digital assistant. The wireless interface includes a millimeter wave generator and antenna array. The millimeter wave generator may be part of a monolithic microwave integrated circuit.

According to some embodiments, processor 910 represents a CPU or a GPU, and can include one or more physical devices, such as microprocessors, application processors, microcontrollers, programmable logic devices, or other processing means. Processor 910 may be coupled to a memory controller or high-speed serial I/O interface controller, as disclosed. The processing operations performed by processor 910 include the execution of an operating platform or operating system on which applications and/or device functions are executed. The processing operations include operations related to I/O (input/output) with a human user or with other devices, operations related to power management, and/or operations related to connecting the computing device 900 to another device. The processing operations may also include operations related to audio I/O and/or display I/O.

In one embodiment, computing device 900 includes audio subsystem 920, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 900, or connected to the computing device 900. In one embodiment, a user interacts with the computing device 900 by providing audio commands that are received and processed by processor 910

Display subsystem 930 represents hardware (e.g., display devices) and software (e.g., drivers) components that provide a visual and/or tactile display for a user to interact with the computing device 900. Display subsystem 930 includes display interface 932 which includes the particular screen or hardware device used to provide a display to a user. In one embodiment, display interface 932 includes logic separate from processor 910 to perform at least some processing related to the display. In one embodiment, display subsystem 930 includes a touch screen (or touch pad) device that provides both output and input to a user.

I/O controller 940 represents hardware devices and software components related to interaction with a user. I/O controller 940 is operable to manage hardware that is part of audio subsystem 920 and/or display subsystem 930. Additionally, I/O controller 940 illustrates a connection point for additional devices that connect to computing device 900 through which a user might interact with the system. For example, devices that can be attached to the computing device 900 might include microphone devices, speaker or stereo systems, video systems or other display devices, keyboard or keypad devices, or other I/O devices for use with specific applications such as card readers or other devices.

As mentioned above, I/O controller 940 can interact with audio subsystem 920 and/or display subsystem 930. For example, input through a microphone or other audio device can provide input or commands for one or more applications or functions of the computing device 900. Additionally, audio output can be provided instead of, or in addition to display output. In another example, if display subsystem 930 includes a touch screen, the display device also acts as an input device, which can be at least partially managed by I/O controller 940. There can also be additional buttons or switches on the computing device 900 to provide I/O functions managed by I/O controller 940.

In one embodiment, I/O controller 940 manages devices such as accelerometers, cameras, light sensors or other environmental sensors, or other hardware that can be included in the computing device 900. The input can be part of direct user interaction, as well as providing environmental input to the system to influence its operations (such as filtering for noise, adjusting displays for brightness detection, applying a flash for a camera, or other features).

In one embodiment, computing device 900 includes power management 950 that manages battery power usage, charging of the battery, and features related to power saving operation. Memory subsystem 960 includes memory devices for storing information in computing device 900. Memory can include nonvolatile (state does not change if power to the memory device is interrupted) and/or volatile (state is indeterminate if power to the memory device is interrupted) memory devices. Memory subsystem 960 can store application data, user data, music, photos, documents, or other data, as well as system data (whether long-term or temporary) related to the execution of the applications and functions of the computing device 900.

Elements of embodiments are also provided as a machine-readable medium (e.g., memory 960) for storing the computer-executable instructions. The machine-readable medium (e.g., memory 960) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity via network interface 970 includes hardware devices (e.g., wireless and/or wired connectors and communication hardware) and software components (e.g., drivers, protocol stacks) to enable the computing device 900 to communicate with external devices. The computing device 900 could be separate devices, such as other computing devices, wireless access points or base stations, as well as peripherals such as headsets, printers, or other devices.

Network interface 970 can include multiple different types of connectivity. To generalize, the computing device 900 is illustrated with cellular connectivity 972 and wireless connectivity 974. Cellular connectivity 972 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 974 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 980 include hardware interfaces and connectors, as well as software components (e.g., drivers, protocol stacks) to make peripheral connections. It will be understood that the computing device 900 could both be a peripheral device ("to" 982) to other computing devices, as well as have peripheral devices ("from" 984) connected to it. The computing device 900 commonly has a "docking" connector to connect to other computing devices for purposes such as managing (e.g., downloading and/or uploading, changing, synchronizing) content on computing device 900. Additionally, a docking connector can allow computing device 900 to connect to certain peripherals that allow the computing device 900 to control content output, for example, to audiovisual or other systems.

In addition to a proprietary docking connector or other proprietary connection hardware, the computing device 900 can make peripheral connections 980 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

Example 1 is an integrated circuit device, comprising a substrate comprising a dielectric material; and a conductor on or within the dielectric material of the substrate, the conductor comprising a first portion comprising a first sloped sidewall, wherein a first base width of the first portion is greater than a first top width of the first portion; and a second portion over the first portion, the second portion comprising a second sloped sidewall, wherein a second base width of the upper portion is greater than both a second top width of the second portion and the first top width of the first portion.

Example 2 includes all of the features of example 1, wherein the second portion overhangs the first sidewall of the first portion by a distance that is substantially equal to half of the difference between the second base width and the first top width.

Example 3 includes all of the features of examples 1 or 2, wherein the first portion has a first z-height and the second portion has a second z-height, and wherein the second z-height is greater than the first z-height, Example 4 includes all of the features of example 3, wherein the sum of the first z-height and the second z-height is equal to or greater than the second base width of the second portion.

Example 5 includes all of the features of any one of examples 1 through 4, wherein the first sidewall and the second sidewall have a convex curvature.

Example 6 includes all of the features of any one of examples 1 through 5, further comprising at least a third portion over the second portion, the third portion comprising a third sloped sidewall, wherein a third base width of the third portion is greater than a third top width of the third portion.

Example 7 includes all of the features of example 6, wherein the third portion overhangs the second sidewall of the second portion by a distance that is substantially equal to half of the difference between the third base width and the second top width.

Example 8 includes all of the features of examples 6 or 7, wherein the third portion overhangs the second sidewall of the second portion by a distance that is substantially equal to half of the difference between the third base width and the second top width.

Example 9 includes all of the features of any one of examples 1 through 8, wherein the conductor is a first conductor, wherein a second conductor is adjacent to the first conductor, the second conductor comprising a third portion comprising a third sloped sidewall and having a third base width greater than a third top width, wherein the third sidewall is adjacent to the first sloped sidewall, and a fourth portion over the third portion, the fourth portion comprising a fourth sloped sidewall and having a fourth base width greater than a fourth top width, wherein the fourth sidewall is adjacent to the second sloped sidewall.

Example 10 includes all of the features of example 9, wherein a first minimum distance is between the first sidewall and the third sidewall and a second minimum distance is between the second sidewall and the fourth sidewall, wherein the second minimum distance is less than the first minimum distance.

Example 11 includes all of the features of example 10, wherein the second minimum distance is less than 10 microns.

Example 12 includes all of the features of any one of examples 1 through 11, wherein the conductor has a substantially circular perimeter having a diameter, wherein the second base width is approximately equal to the diameter of the conductor.

Example 13 includes all of the features of any one of examples 1 through 12, wherein the conductor has a rectangular perimeter having a width and a length, wherein the second base width is approximately equal to the width of the conductor.

Examples 14 includes all of the features of example 13, wherein the length of the rectangular perimeter of the conductor is greater than the width of the rectangular perimeter of the conductor.

Example 15 includes all of the features of examples 13 or 14, wherein the width of the conductor is less than 10 microns.

Example 16 is a system, comprising an electronic substrate comprising a substrate, the electronic substrate comprising a dielectric material, and a conductor on or within the dielectric material of the substrate, the conductor comprising a first portion comprising a first sloped sidewall, wherein a first base width of the first portion is greater than a first top width of the first portion; and a second portion over the first portion, the second portion comprising a second sloped sidewall, wherein a second base width of the upper portion is greater than both a second top width of the second portion and the first top width of the first portion; and an integrated circuit (IC) die electrically coupled to the conductor.

Example 17 includes all of the features of example 16, wherein the electronic substrate is a printed circuit board (PCB) or an IC package substrate.

Example 18 includes all of the features of examples 16 or 17, wherein the IC die comprises a power interconnect electrically coupled to the conductor on or within the PCB or the IC package substrate.

Example 19 includes all of the features of examples 17 or 18, wherein the electronic substrate is a PCB and the conductor has a z-height greater than 35 microns, and wherein the conductor is a power trace or an interconnect on or within the PCB.

Example 20 is a method comprising forming one or more first cavities to a first depth below a surface of a copper layer through one or more first openings in an etch mask deposited on the copper layer, wherein the etch mask comprises a first photoresist, depositing a second photoresist through the one or more first openings of the etch mask into the one or more first cavities formed at the surface of the copper layer, forming one or more second openings in the second photoresist deposited into the one or more first cavities, wherein the one or more second openings extend from a surface of the second photoresist within the one or more first openings to the first depth of the one or more first cavities, and forming one or more second cavities to a second depth below the one or more first cavities.

Example 21 includes all of the features of example 20, wherein the first photoresist comprises a negative-tone photoresist and the second photoresist comprises a positive-tone photoresist, and wherein the negative-tone photoresist laminated over the copper layer.

Example 22 includes all of the features of examples 20 or 21, wherein forming the one or more second openings comprises exposing the second photoresist within the first or second cavities to illumination through the one or more first openings, and developing the second photoresist to form the one or more second openings, and wherein the one or more second openings are self-aligned to the one or more first openings.

Example 23 includes all of the features of any one of examples 29 through 22, wherein forming one or more second cavities to a second depth below the one or more first cavities comprises an isotropic chemical etch, wherein a chemical etchant etches the or more second cavities in the copper layer through the one or more second openings.

Example 24 includes all of the features of example 23, wherein etching the one or more second cavities to a second depth comprises timing the isotropic chemical etch, wherein the chemical etchant enters the second cavities through the one or more second openings for a predetermined time.

Example 25 includes all of the features of any one of examples 20 through 24, further comprising forming one or more third cavities to a third depth below the one or more second cavities, wherein forming the one or more third cavities comprises removing the second photoresist from the one or more first cavities and re-depositing the second photoresist into the one or more second cavities and into the one or more first cavities, wherein one or more third openings is formed in the second photoresist to a third depth comprising the sum of the first depth and the second depth, and wherein the third openings are self-aligned to the first openings.

An abstract is submitted with the understanding that it will not be used to limit the scope or meaning of the claims. The following claims are hereby incorporated into the detailed description, with each claim standing on its own as a separate embodiment.

We claim:

1. An integrated circuit (IC) device, comprising:
   a substrate comprising a dielectric material; and
   a conductor on or within the dielectric material of the substrate, the conductor comprising:
      a first portion comprising a first sloped sidewall, a first base, and a first top, wherein the first sloped sidewall is from the first top to the first base, and a first base width of the first portion is greater than a first top width of the first portion; and
      a second portion over the first portion, the conductor comprising a conductive material. the conductive material continuous between and comprising the first and second portions, the second portion comprising a second sloped sidewall, a second base, and a second top, wherein:
         the second sloped sidewall is from the second top to the second base; and
         a second base width of the second portion is greater than both:
            a second top width of the second portion; and
            the first base width of the first portion.

2. The IC device of claim 1, wherein the second portion overhangs the first sloped sidewall of the first portion by a distance that is substantially equal to half of a difference between the second base width and the first top width.

3. The IC device of claim 1, further comprising at least a third portion over the second portion, the third portion comprising a third sloped sidewall, wherein a third base width of the third portion is greater than a third top width of the third portion.

4. The IC device of claim 3, wherein the third portion overhangs the second sloped sidewall of the second portion by a distance that is substantially equal to half of a difference between the third base width and the second top width.

5. The IC device of claim 3, wherein the first portion of the conductor has a first z-height, the second portion of the conductor has a second z-height and the third portion of the conductor has a third z-height, and wherein a sum of the first, second and third z-heights is approximately equal to or greater than the third base width of the conductor.

6. The IC device of claim 1, wherein the conductor is a first conductor, wherein a second conductor is adjacent to the first conductor, the second conductor comprising:
   a third portion comprising a third sloped sidewall and having a third base width greater than a third top width, wherein the third sloped sidewall is adjacent to the first sloped sidewall, and
   a fourth portion over the third portion, the fourth portion comprising a fourth sloped sidewall and having a fourth base width greater than a fourth top width, wherein the fourth sloped sidewall is adjacent to the second sloped sidewall.

7. The IC device of claim 6, wherein: a first minimum distance is between the first sloped sidewall and the third sloped sidewall, and a second minimum distance is between the second sloped sidewall and the fourth sloped sidewall, wherein the second minimum distance is less than the first minimum distance.

8. The IC device of claim 7, wherein the second minimum distance is less than 10 microns.

9. The IC device of claim 1, further comprising an IC die coupled to the conductor and to the substrate by the conductor.

10. An integrated circuit (IC) device, comprising:
    a substrate comprising a dielectric material; and
    a conductor within the dielectric material of the substrate, the conductor comprising:
       a first portion comprising a first base having a first base width, a first top having a first top width, and a first sloped sidewall from the first top to the first base, the first base width greater than the first top width, the first sloped sidewall in contact with the dielectric material; and
       a second portion over the first portion, the conductor comprising a conductive material, the conductive material continuous between and comprising the first and second portions, the second portion comprising a second base having a second base width, a second top having a second top width, and a second sloped sidewall from the second top to the second base, the second base width greater than the second top width, the second sloped sidewall in contact with the dielectric material, and an overhang from the second sloped sidewall to the first sloped sidewall.

11. The IC device of claim 10, wherein the first portion has a first z-height and the second portion has a second z-height, and wherein the second z-height is greater than the first z-height.

12. The IC device of claim 11, wherein a sum of the first z-height and the second z-height is equal to or greater than the second base width of the second portion.

13. The IC device of claim 10, wherein the first sloped sidewall and the second sloped sidewall have a convex curvature.

14. The IC device of claim 10, further comprising an IC die coupled to the conductor and to the substrate by the conductor.

15. The IC device of claim 14, wherein the substrate is a printed circuit board (PCB) or an IC package substrate.

16. The IC device of claim 15, wherein the IC die comprises a power interconnect electrically coupled to the conductor on or within the PCB or the IC package substrate.

17. The IC device of claim 15, wherein the substrate is the PCB and the conductor has a z-height greater than 35 microns, and wherein the conductor is a power trace or an interconnect on or within the PCB.

18. An integrated circuit (IC) device, comprising:
a substrate comprising a dielectric material; and
a conductor on or within the dielectric material of the substrate, the conductor having a pagoda-like cross-section, the conductor comprising:
a first portion comprising a first curved sidewall and a top of the first portion; and
a second portion over the first portion, the second portion comprising a second curved sidewall, a base of the second portion, and an overhang over the first curved sidewall, wherein a second base width of the second portion is greater than a first top width of the first portion, and the overhang is from the first curved sidewall and the top of the first portion to the second curved sidewall and the base of the second portion.

19. The IC device of claim 18, wherein the first portion has a first z-height and the second portion has a second z-height, and wherein the second z-height is greater than the first z-height.

20. The IC device of claim 19, wherein a sum of the first z-height and the second z-height is equal to or greater than the second base width of the second portion.

21. The IC device of claim 18, wherein the conductor has a substantially circular perimeter having a diameter, and the second base width is approximately equal to the diameter of the conductor.

22. The IC device of claim 18, wherein the conductor has a rectangular perimeter having a rectangular perimeter width and a rectangular perimeter length, and the second base width is approximately equal to the rectangular perimeter width of the conductor.

23. The IC device of claim 22, wherein the rectangular perimeter length of the conductor is greater than the rectangular perimeter width of the conductor.

24. The IC device of claim 22, wherein the rectangular perimeter width of the conductor is less than 10 microns.

25. The IC device of claim 18, further comprising an IC die coupled to the conductor and to the substrate by the conductor.

* * * * *